US012635179B2

(12) United States Patent
Yu et al.

(10) Patent No.: US 12,635,179 B2
(45) Date of Patent: May 19, 2026

(54) SEMICONDUCTOR STRUCTURE WITH FRONT SIDE SOURCE DRAIN CONTACT AND OPPOSITELY POSITIONED SOURCE DRAIN CONTACTS

(71) Applicant: Taiwan Semiconductor Manufacturing Company, Ltd., Hsinchu (TW)

(72) Inventors: Li-Zhen Yu, New Taipei City (TW); Lin-Yu Huang, Hsinchu (TW); Huan-Chieh Su, Tianzhong Township, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 945 days.

(21) Appl. No.: 17/836,399

(22) Filed: Jun. 9, 2022

(65) Prior Publication Data

US 2023/0402546 A1     Dec. 14, 2023

(51) Int. Cl.
| | |
|---|---|
| *H10D 30/43* | (2025.01) |
| *H01L 21/02* | (2006.01) |
| *H01L 21/28* | (2006.01) |
| *H10D 30/01* | (2025.01) |
| *H10D 30/67* | (2025.01) |
| *H10D 62/10* | (2025.01) |
| *H10D 64/62* | (2025.01) |
| *H10D 64/66* | (2025.01) |

(52) U.S. Cl.
CPC ... *H10D 30/6713* (2025.01); *H01L 21/02603* (2013.01); *H01L 21/28123* (2013.01); *H10D 30/014* (2025.01); *H10D 30/031* (2025.01);

*H10D 30/43* (2025.01); *H10D 30/6729* (2025.01); *H10D 30/6735* (2025.01); *H10D 30/6757* (2025.01); *H10D 62/121* (2025.01); *H10D 64/62* (2025.01); *H10D 64/679* (2025.01)

(58) Field of Classification Search
CPC .............. H01L 21/00; H01L 21/76897; H10D 30/6713; H10D 30/6735; H10D 62/121
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |

(Continued)

*Primary Examiner* — William B Partridge
*Assistant Examiner* — Mehek Ahmed
(74) *Attorney, Agent, or Firm* — Birch, Stewart, Kolasch & Birch, LLP

(57) ABSTRACT

Semiconductor structures and methods for manufacturing the same are provided. The semiconductor structure includes nanostructures over a substrate, and a gate structure surrounding the nanostructures. The gate structure includes gate dielectric layers and gate electrode layers. The semiconductor structure also includes a source/drain (S/D) structure adjacent to the gate structure, and an inner spacer layer between the gate structure and the S/D structure. The semiconductor structure further includes a filling layer over the gate structure, and the filling layer has a protrusion portion embedded in a space, the space is surrounded by the inner spacer, the gate dielectric layer and the gate electrode layer. The semiconductor structure also includes a first S/D contact structure formed over the filling layer.

20 Claims, 34 Drawing Sheets

(56)  References Cited

U.S. PATENT DOCUMENTS

| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 10,937,884 | B1 * | 3/2021 | Wang .................... H01L 21/764 |
| 2023/0197724 | A1 * | 6/2023 | Majhi .................. H10D 84/017 |

* cited by examiner

100a 108
106
108
106
108
106

102

Z
Y X

100a

104

108
106
108
106
108
106

105

102

100a

122

126
124
120
118

116

108
106
108
106
108
106

112

102

104

100a

122

126
124
120
118

116

128
128
128

108
106
108
106
108
106

112

102

104

100a

100a

120

142 144 120

120

118

140

134

134

138

108

106

134

144

142

140

138

112

102

104

100a

100a

177

176

174

168
170
138

140

162

164

142 144

138
134
152
150
128
154
162

148

156

140

100a

100a

100e

186

184

138

134

152

150

148

128

154

170

168
138

140

162

164

156

100f 186   185

184

138

134

152

150

148

128

154

170

168
138

140

162

164

156

SEMICONDUCTOR STRUCTURE WITH FRONT SIDE SOURCE DRAIN CONTACT AND OPPOSITELY POSITIONED SOURCE DRAIN CONTACTS

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
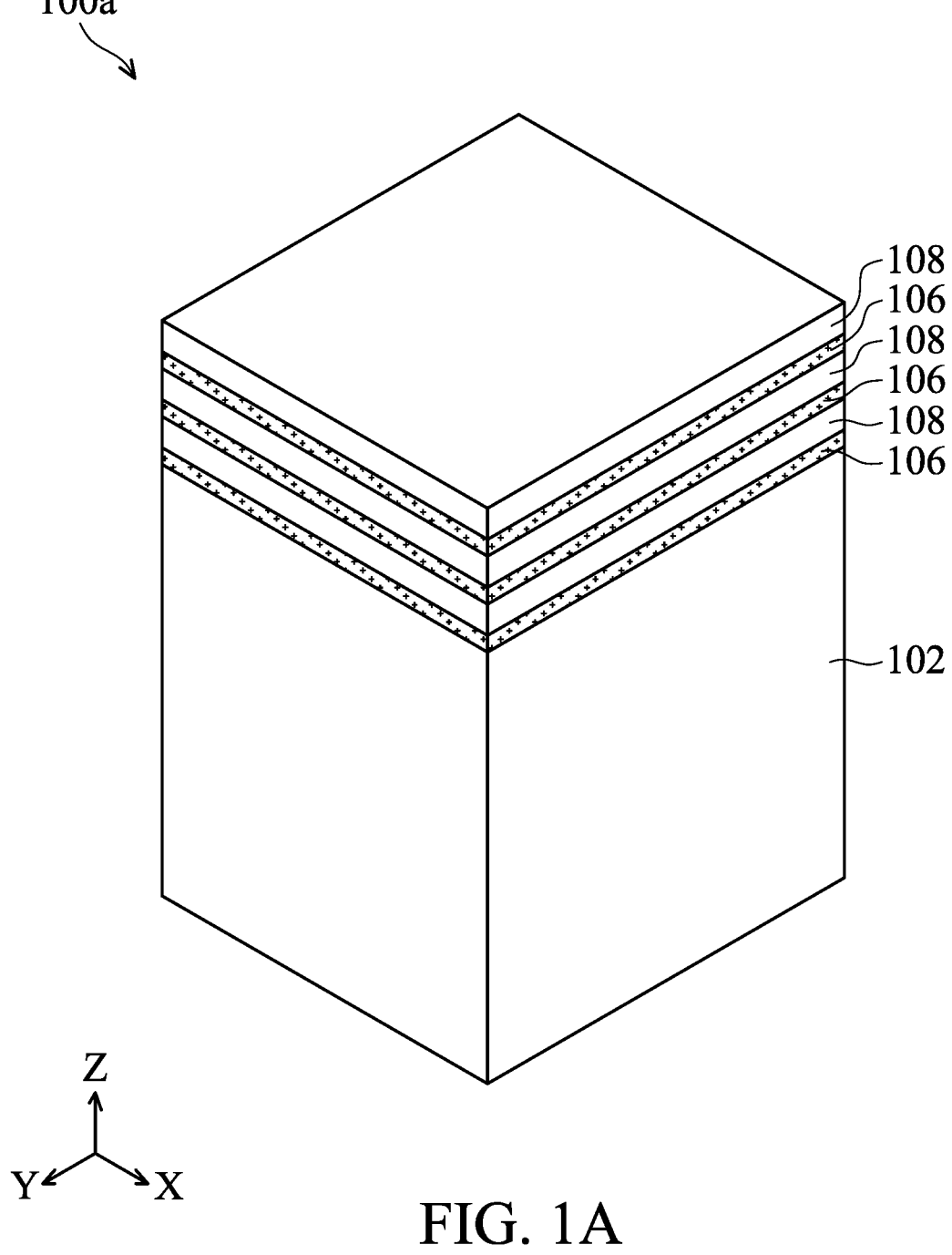
FIGS. 1A to 1Y illustrate diagrammatic perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of semiconductor structures and methods for forming the same are provided. The semiconductor structures may include nanostructures formed over a substrate and a gate structure wraps around the nanostructures. A source/drain (S/D) structure is formed attached to the nanostructures. A front side S/D contact structure and a back side S/D contact structure are formed on opposite sides of the S/D structure. The gate structure includes gate dielectric layers and gate electrode layers. A portion of the gate dielectric layer is replaced with a filling layer. The filling layer is between the gate electrode layer and the back side S/D contact structure. The filling layer is used to improve the isolation capability. The filling layer and the gate dielectric layer are made of different materials. The filling layer has a better isolation ability or capability than the gate dielectric layer. The size of the back side S/D contact structure is also increased since the isolation capability is improved. In addition, the back side S/D contact structure may be formed directly over the nanostructures. Accordingly, the reality of the semiconductor structure 100a is improved. The Source/drain (S/D) structure(s) or region(s) may refer to a source or a drain, individually or collectively dependent upon the context.

FIGS. 1A to 1Z illustrate diagrammatic perspective views of intermediate stages of manufacturing a semiconductor structure 100a in accordance with some embodiments. In addition, the figures may have been simplified for the sake of clarity to better understand the inventive concepts of the present disclosure. Additional features may be added in the semiconductor structure 100a, and some of the features described below may be replaced, modified, or eliminated.

The semiconductor structure 100a may include multi-gate devices and may be included in a microprocessor, a memory, or other IC devices. For example, the semiconductor structure 100 may be a portion of an IC chip that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or a combination thereof.

First, as shown in FIG. 1A, a semiconductor stack, including first semiconductor material layers 106 and second semiconductor material layers 108, is formed over a substrate 102, in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102 to form the semiconductor stack. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although two first semiconductor material layers 106 and two second semiconductor material layers 108 are shown in FIG. 1A, the semiconductor structure may include more or fewer first semiconductor material layers 106 and second semiconductor material layers 108. For example, the semiconductor structure may include two to five of the first semiconductor material layers 106 and two to five of the second semiconductor material layers 108.

The first semiconductor material layers 106 and the second semiconductor material layers 108 may be formed using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
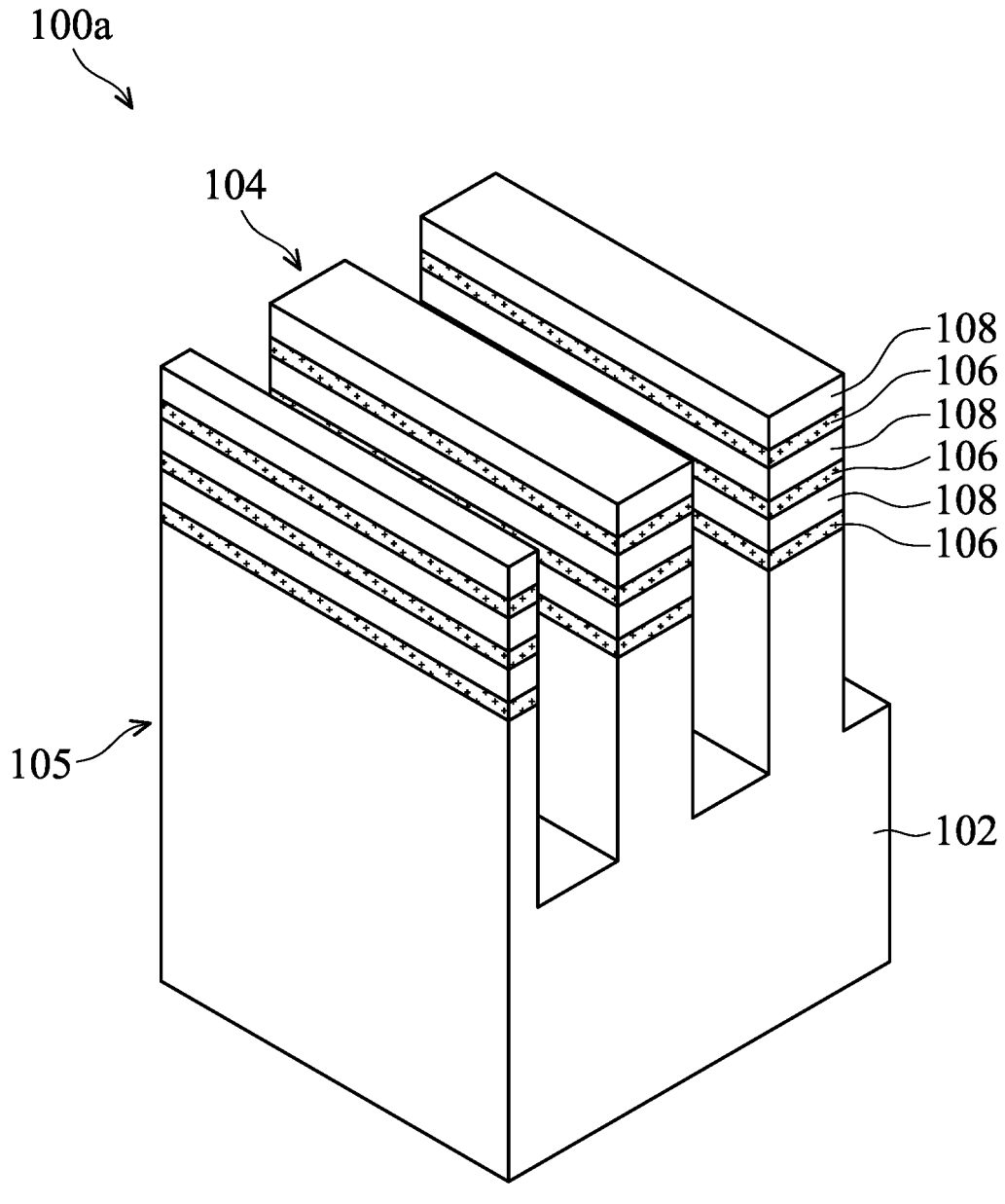

Afterwards, as shown in FIG. 1B, after the first semiconductor material layers 106 and the second semiconductor material layers 108 are formed as the semiconductor material stack over the substrate 102, the semiconductor material stack is patterned to form fin structures 104 extending in a first direction, in accordance with some embodiments.

In some embodiments, the fin structures 104 are protruding from the front side of the substrate 102. In some embodiments, the fin structures 104 include base fin structures 105 and the semiconductor material stacks, including the first semiconductor material layers 106 and the second semiconductor material layers 108, formed over the base fin structure 105.

In some embodiments, the patterning process includes forming mask structures over the semiconductor material stack and etching the semiconductor material stack and the underlying substrate 102 through the mask structure. In some embodiments, the mask structures are a multilayer structure including a pad oxide layer and a nitride layer formed over the pad oxide layer. The pad oxide layer may be made of silicon oxide, which may be formed by thermal oxidation or CVD, and the nitride layer may be made of silicon nitride, which may be formed by CVD, such as LPCVD or plasma-enhanced CVD (PECVD).

Figure 1C:
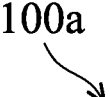
Figure 1C:
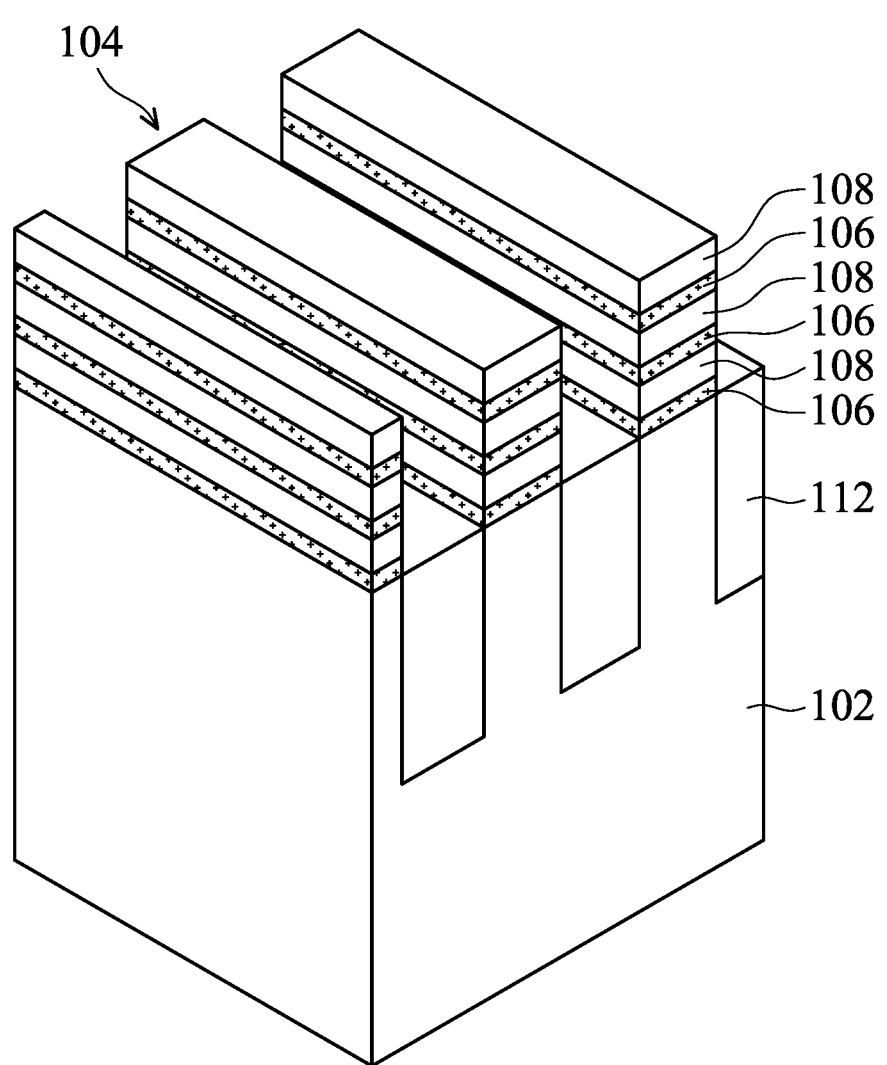

Next, as shown in FIG. 1C, after the fin structures 104 are formed, an isolation structure 112 is formed to cover the lower sidewalls of the fin structures 104, in accordance with some embodiments. In some embodiments, the isolation liner (not shown) is formed on sidewalls of the fin structure 104, and it is made of a single or multiple dielectric materials. In some embodiments, the isolation liner includes an oxide layer and a nitride layer formed over the oxide layer. In some embodiments, the isolation structure 112 is made of silicon oxide, silicon nitride, silicon oxynitride (SiON), other applicable insulating materials, or a combination thereof.

The isolation structure 112 may be formed by conformally forming a liner layer covering the fin structures 104, forming an insulating material over the liner layer, and recessing the liner layer and the insulating material to form the isolation liner 110 and the isolation structure 112. The isolation structure 112 is configured to electrically isolate active regions (e.g. the fin structures 104) of the semiconductor structure and is also referred to as shallow trench isolation (STI) feature in accordance with some embodiments. In some embodiments, the isolation structure 112 is directly formed over the substrate 102 around the fin structures 104 without forming the isolation liner.

Figure 1D:
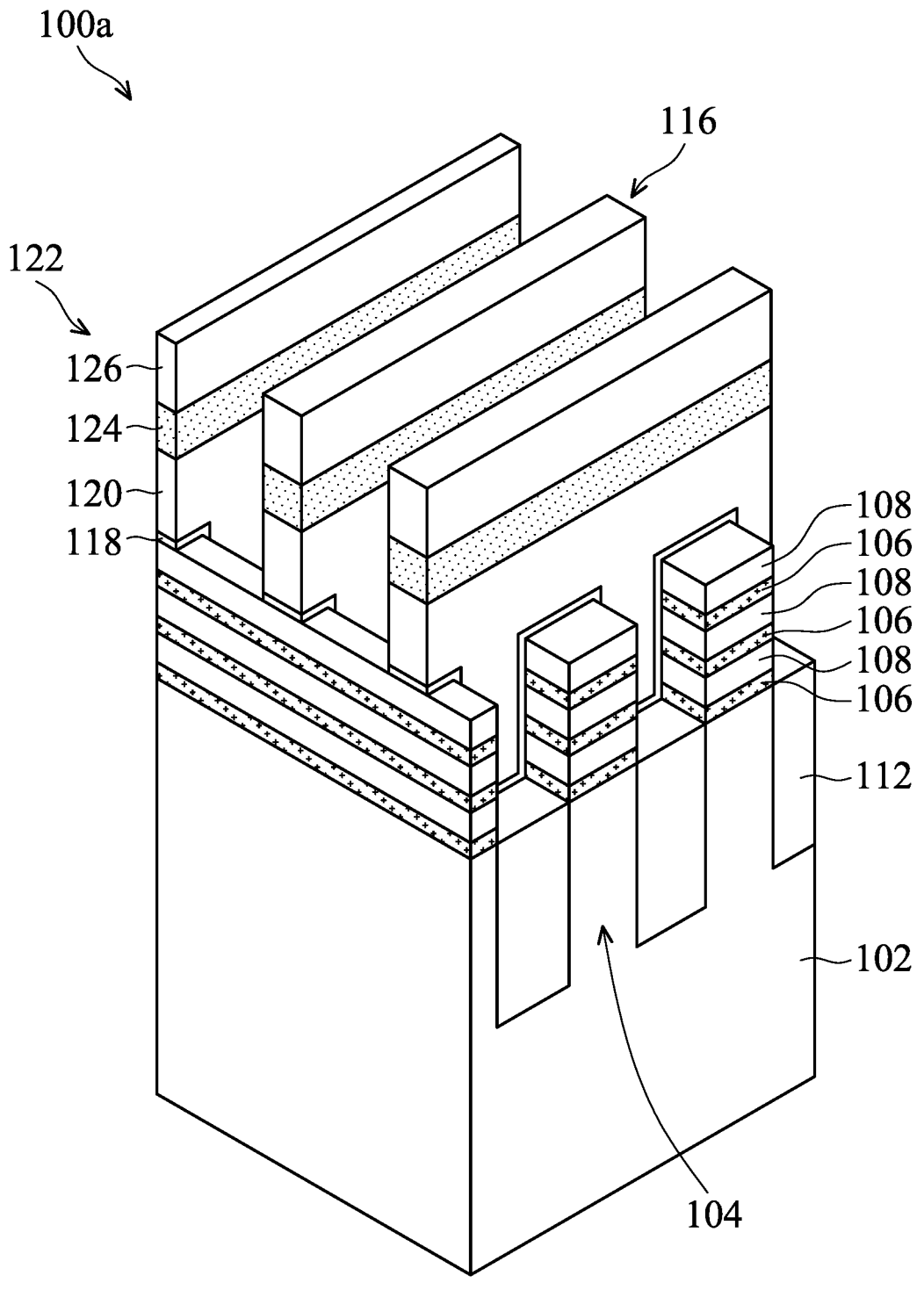

Afterwards, as shown in FIG. 1D, after the isolation structure 112 is formed, dummy gate structures 116 are formed across the fin structure 104, in accordance with some embodiments.

The dummy gate structures 116 may be used to define the source/drain regions and the channel regions of the resulting semiconductor structure 100. In some embodiments, the dummy gate structures 116 include a dummy gate dielectric layer 118 and a dummy gate electrode layer 120. In some embodiments, the dummy gate dielectric layer 118 is made of one or more dielectric materials, such as silicon oxide, silicon nitride, silicon oxynitride (SiON), HfO₂, HfZrO, HfSiO, HfTiO, HfAlO, or a combination thereof. In some embodiments, the dummy gate dielectric layer 118 is formed using thermal oxidation, CVD, ALD, physical vapor deposition (PVD), another suitable method, or a combination thereof.

In some embodiments, the dummy gate electrode layer 120 is made of conductive material includes polycrystalline-silicon (poly-Si), poly-crystalline silicon-germanium (poly-SiGe), or a combination thereof. In some embodiments, the dummy gate electrode layer 120 is formed using CVD, PVD, or a combination thereof.

The formation of the dummy gate structures 116 may include conformally forming a dielectric material as the dummy gate dielectric layers 118. Afterwards, a conductive material may be formed over the dielectric material as the dummy gate electrode layers 120, and a hard mask layer 122 may be formed over the conductive material. Next, the dielectric material and the conductive material may be patterned through the hard mask layer 122 to form the dummy gate structures 116. In some embodiments, the hard mask layers 122 include multiple layers, such as an oxide layer 124 and a nitride layer 126. In some embodiments, the oxide layer 124 is silicon oxide, and the nitride layer 126 is silicon nitride.

Figure 1E:
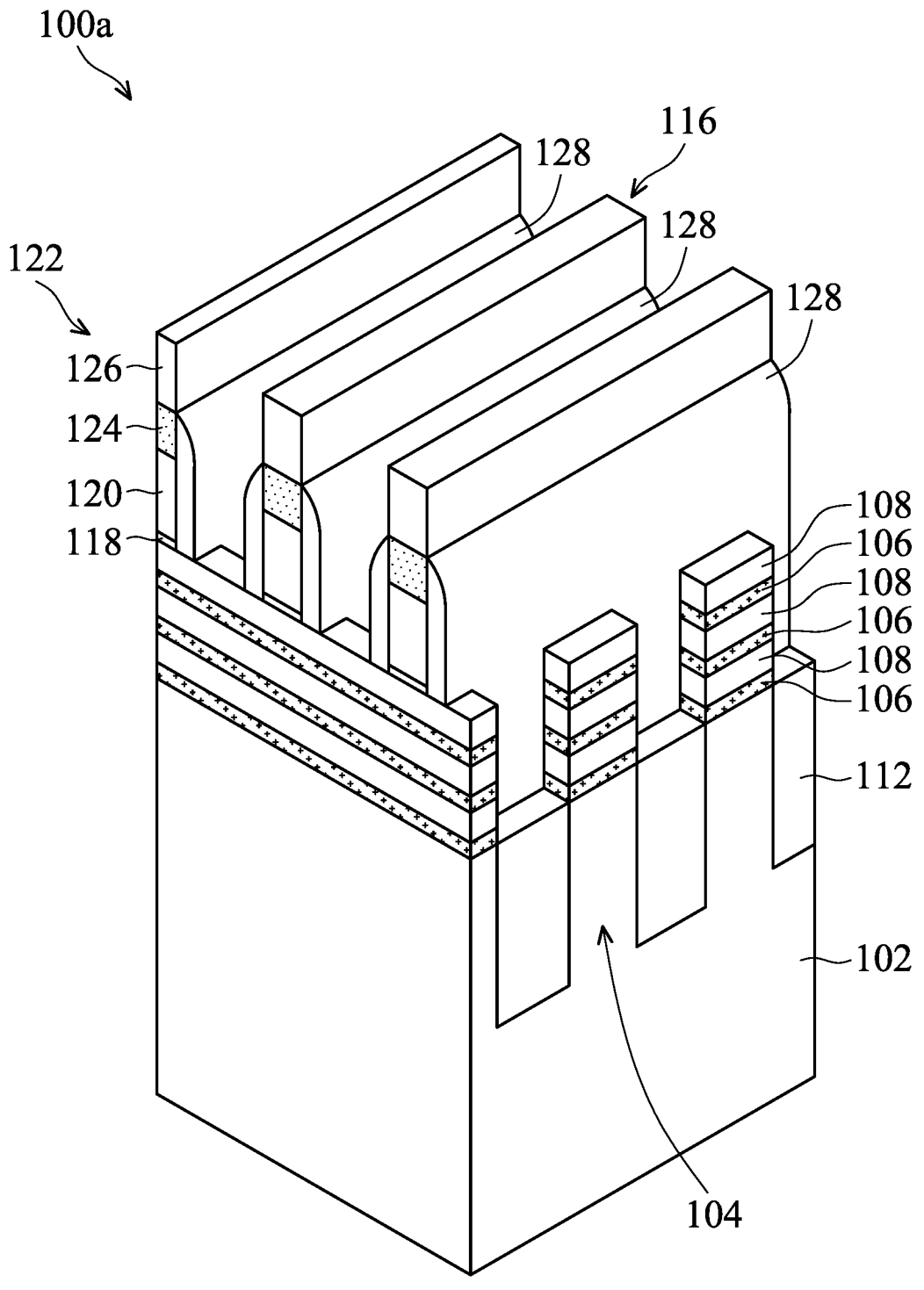

Next, as shown in FIG. 1E, after the dummy gate structures 116 are formed, gate spacers 128 are formed along and covering opposite sidewalls of the dummy gate structures 116, in accordance with some embodiments. The gate spacers 128 may be configured to separate source/drain structures (formed afterwards) from the dummy gate structures 116. In some embodiments, the gate spacers 128 are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), and/or a combination thereof.

Figure 1F:
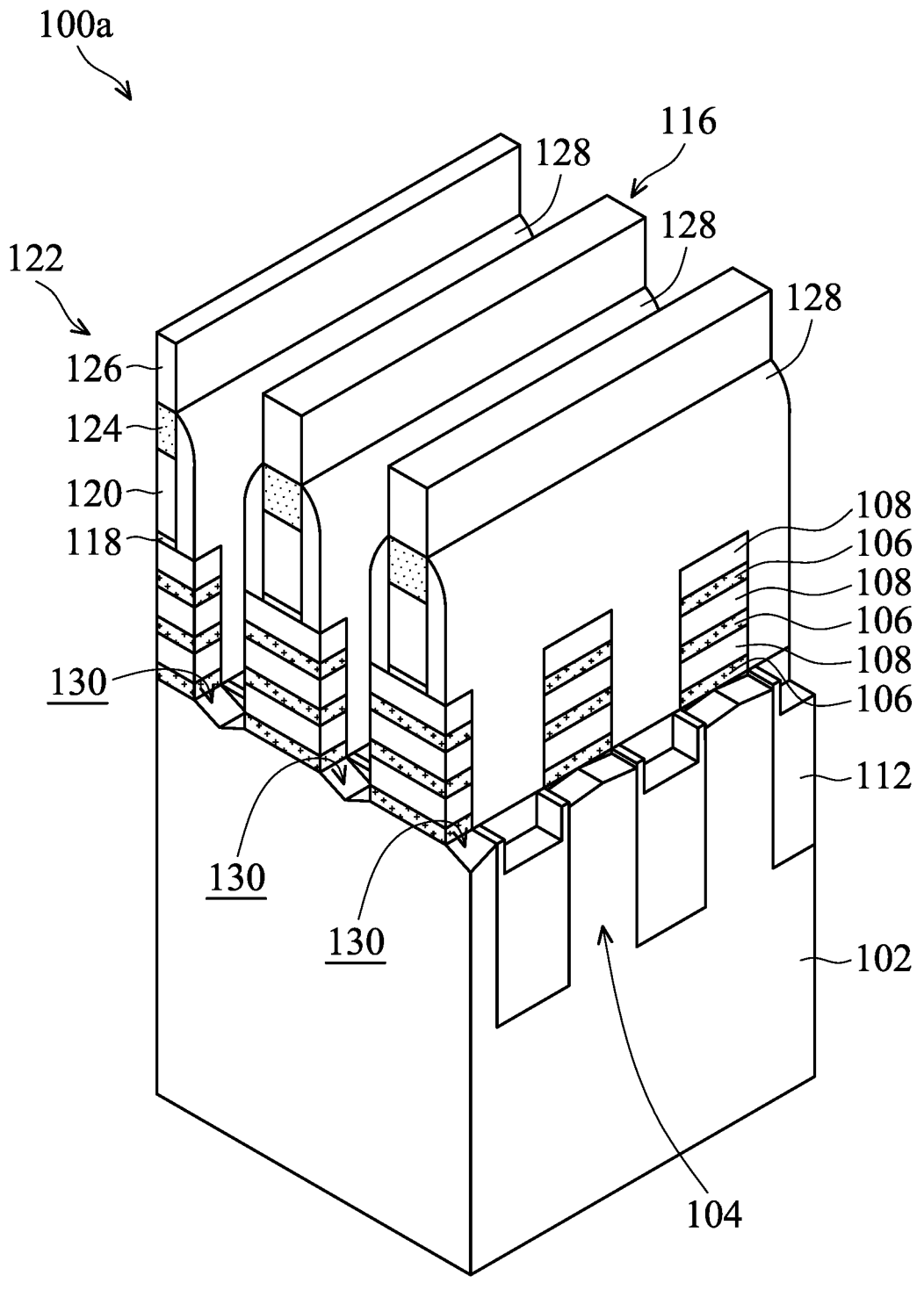

Next, as shown in FIG. 1F, after the gate spacers 128 are formed, source/drain (S/D) recesses 130 are formed adjacent to the gate spacers 128, in accordance with some embodiments. More specifically, the fin structures 104 not covered by the dummy gate structures 116 and the gate spacers 128 are recessed, in accordance with some embodiments.

In some embodiments, the fin structures 104 are recessed by performing an etching process. The etching process may be an anisotropic etching process, such as dry plasma etching, and the dummy gate structure 116 and the gate spacers 128 may be used as etching masks during the etching process.

Figure 1G:
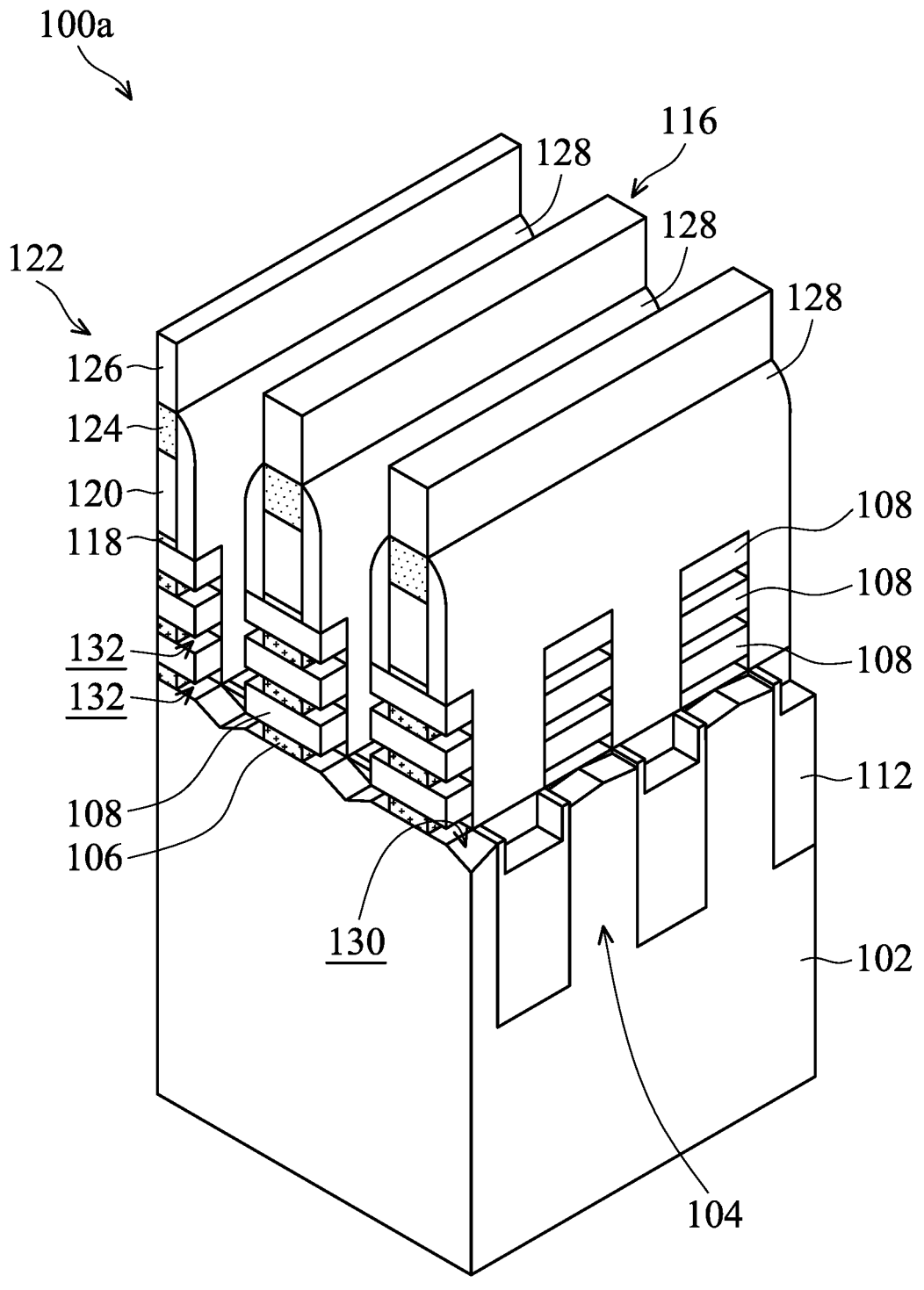

Next, as shown in FIG. 1G, after the S/D recesses 130 are formed, the first semiconductor material layers 106 exposed by the S/D recesses 130 are laterally recessed to form notches 132, in accordance with some embodiments.

In some embodiments, an etching process is performed to laterally recess the first semiconductor material layers 106 of the fin structure 104 from the S/D recesses 130. In some embodiments, during the etching process, the first semiconductor material layers 106 have a greater etching rate (e.g. etching amount) than the second semiconductor material layers 108, thereby forming notches 132 between the adjacent second semiconductor material layers 108. In some embodiments, the etching process is an isotropic etching such as dry chemical etching, remote plasma etching, wet chemical etching, another suitable technique, and/or a combination thereof.

Figure 1H:
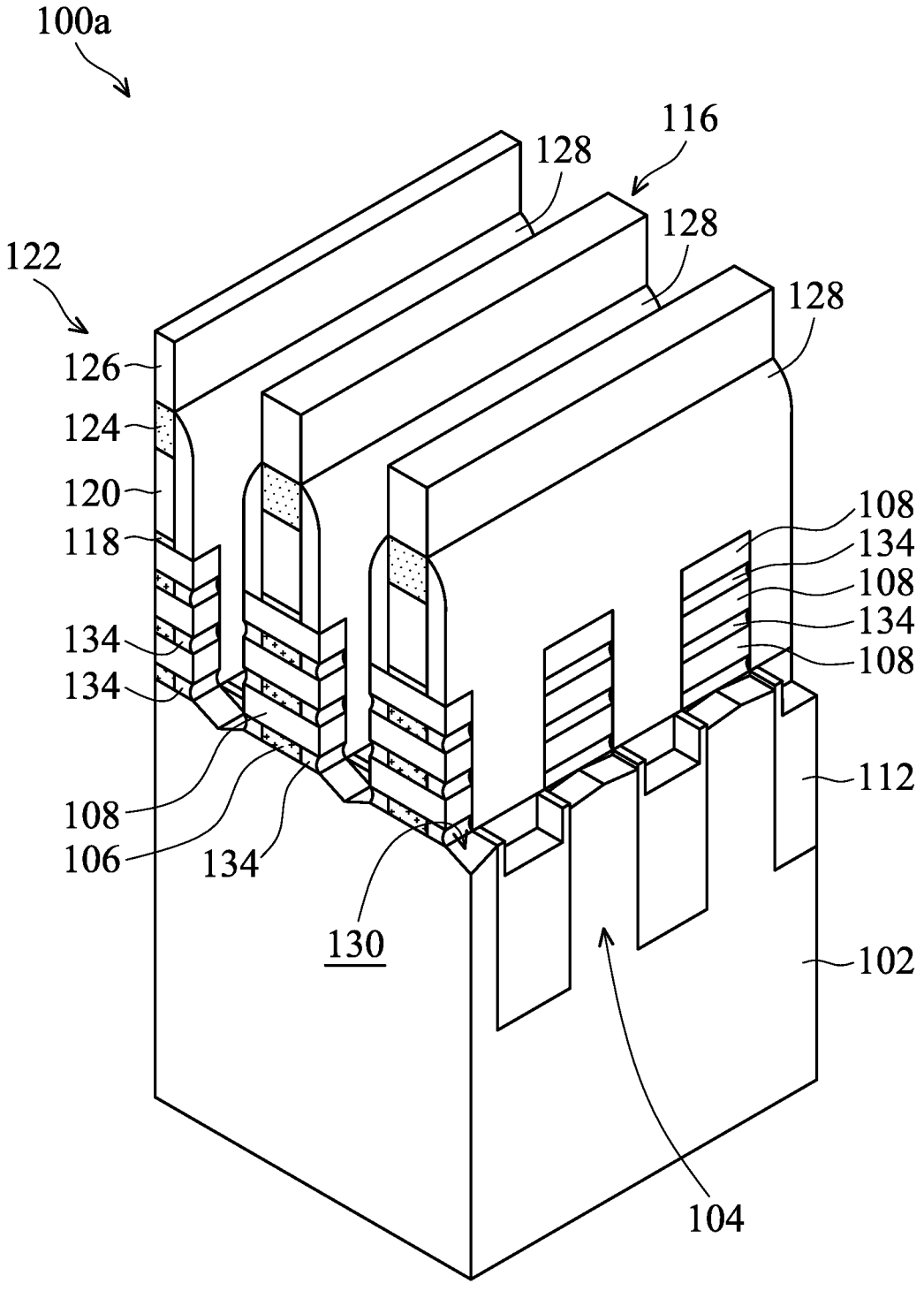

Next, as shown in FIG. 1H, inner spacers 134 are formed in the notches 132 between the second semiconductor material layers 108, in accordance with some embodiments. The inner spacers 134 may be configured to separate the source/drain structures and the gate structures formed in subsequent manufacturing processes. In some embodiments, the inner spacers 134 have curved sidewalls. In some embodiments, the inner spacers 134 are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), or a combination thereof.

Figure 1I:
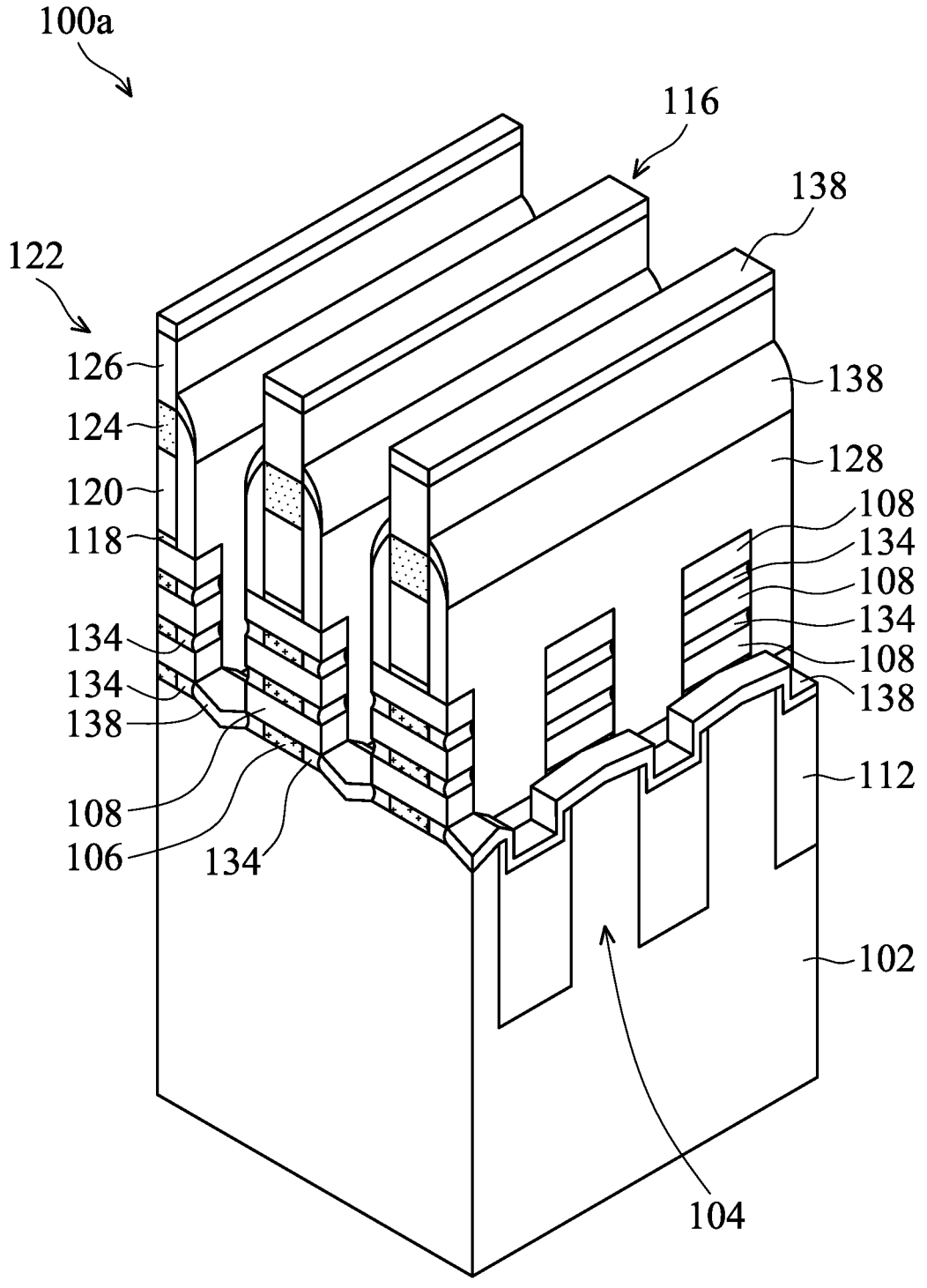

Next, as shown in FIG. 1I, a dielectric layer 138 is formed in the S/D recess 130 and on the isolation structure 112, in accordance with some embodiments. The dielectric layer 138 is configured to protect the S/D structure 140 (formed later) and use as a stop layer in the subsequent steps (shown in FIGS. 1Q and 2B). The dielectric layer 138 is in direct contact with the isolation structure 112, the substrate 102, and the inner spacer layer 134. The dielectric layer 138 has vertical portion and horizontal portion, and the horizontal portion is thicker than the vertical portion. In some embodiments, the dielectric layer 138 is also formed on the top surface of the spacer layer 128 and on the top surface of the hard mask layers 122.

The material of the dielectric layer 138 and the material of the inner spacer layer 134 may be the same or different. In some embodiments, the dielectric layer 138 is made of be SiN, SiCN, SiOCN, SiOC, SiC or another applicable material. In some embodiments, the dielectric layer 138 is formed by a deposition process, such as chemical vapor deposition (CVD), physical vapor deposition, (PVD), atomic layer deposition (ALD), or another applicable process. In some embodiments, the dielectric layer 138 has a thickness in a range from about 1.5 nm to about 5 nm.

Figure 1J:
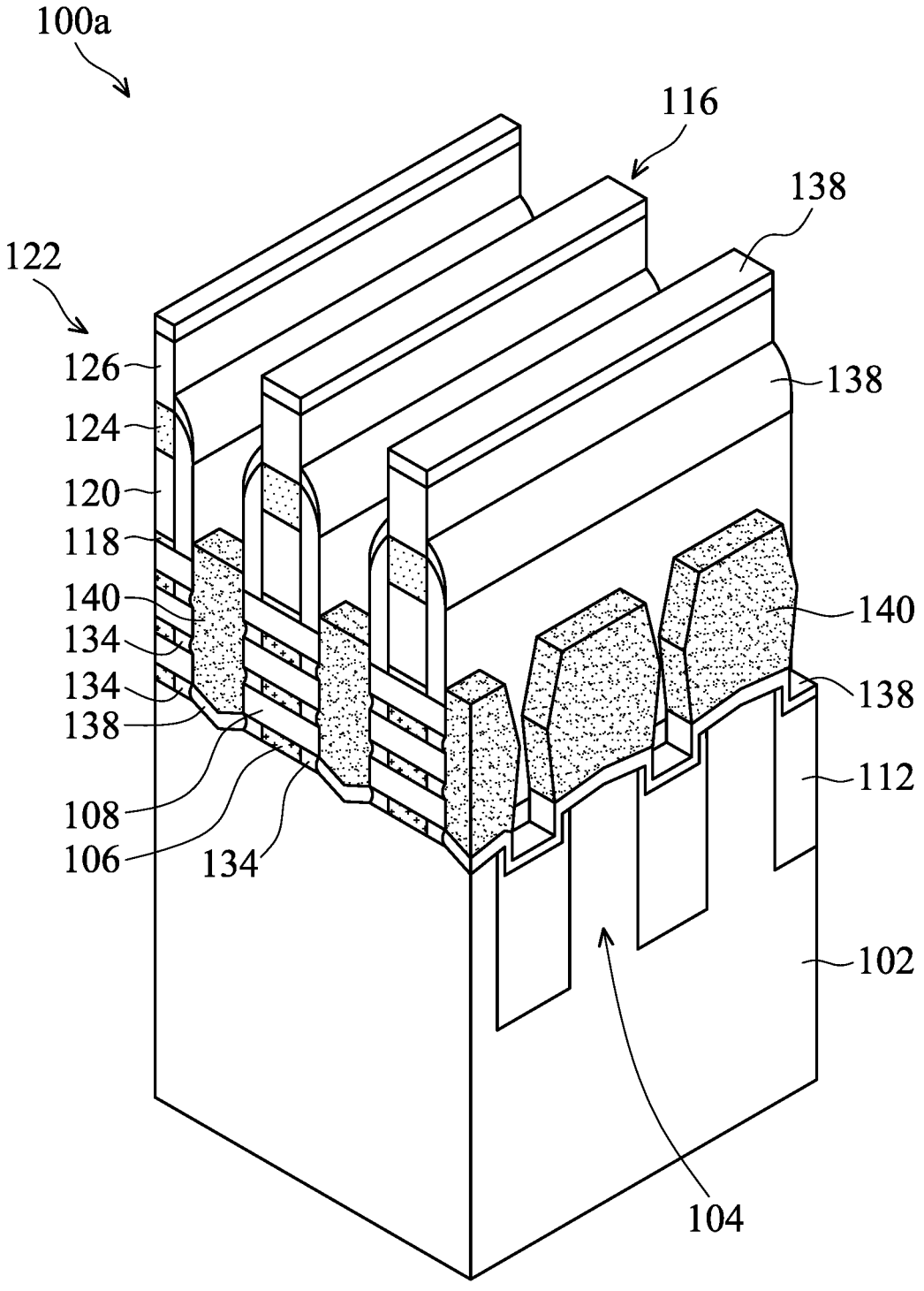

Afterwards, as shown in FIG. 1J, source/drain (S/D) structures 140 are formed over the dielectric layer 138, in accordance with some embodiments. The dielectric layer 138 is configured to reduce the leakage of the S/D structure 140. The S/D structures 140 are isolated from the substrate 102 by the dielectric layer 138. The S/D structures 140 are in direct contact with the dielectric layer 138.

In some embodiments, the S/D structures 140 are formed using an epitaxial growth process, such as MBE, MOCVD, VPE, other applicable epitaxial growth process, or a combination thereof. In some embodiments, the S/D structures 140 are made of any applicable material, such as Ge, Si, GaAs, AlGaAs, SiGe, GaAsP, SiP, SiC, SiCP, or a combination thereof. In some embodiments, the S/D structures 140 are in-situ doped during the epitaxial growth process. For example, the S/D structures 140 may be the epitaxially grown SiGe doped with boron (B). For example, the S/D structures 140 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 140 are doped in one or more implantation processes after the epitaxial growth process.

Figure 1K:
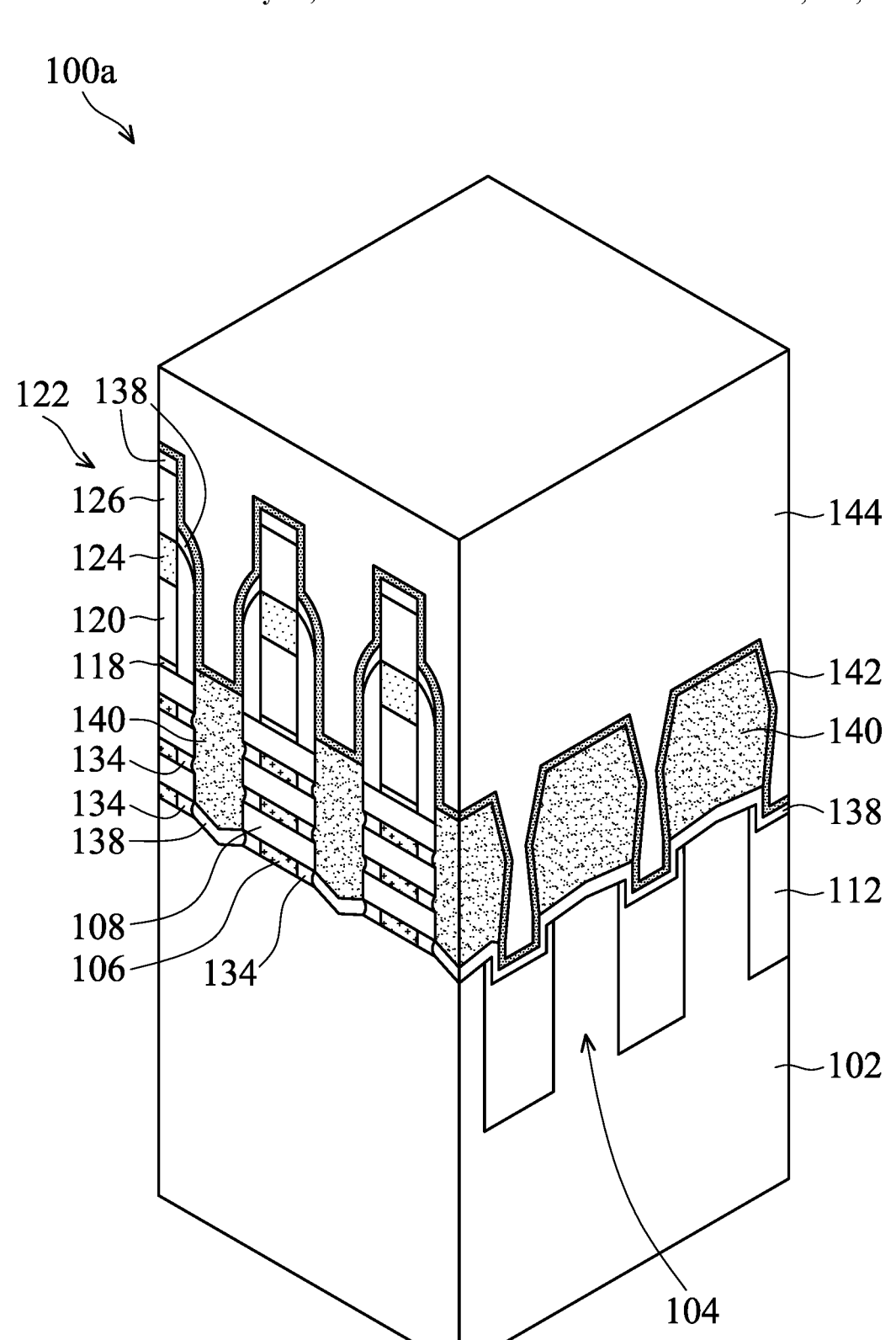

Afterwards, as shown in FIG. 1K, after the S/D structures 140 are formed, a contact etch stop layer (CESL) 142 is conformally formed to cover the source/drain structures 140 and dummy gate structures 116, and an interlayer dielectric (ILD) layer 144 is formed over the CESL 142, in accordance with some embodiments.

In some embodiments, the CESL 142 is made of a dielectric materials, such as silicon nitride, silicon oxide, silicon oxynitride, another suitable dielectric material, or a combination thereof. The dielectric material for the CESL 142 may be conformally deposited over the semiconductor structure by performing CVD, ALD, other application methods, or a combination thereof.

The ILD layer 144 may include multilayers made of multiple dielectric materials, such as silicon oxide, silicon nitride, silicon oxynitride, phosphosilicate glass (PSG), borophosphosilicate glass (BPSG), or other applicable low-k dielectric materials. The ILD layer 144 may be formed by chemical vapor deposition (CVD), physical vapor deposition, (PVD), atomic layer deposition (ALD), or other applicable processes.

Figure 1L:
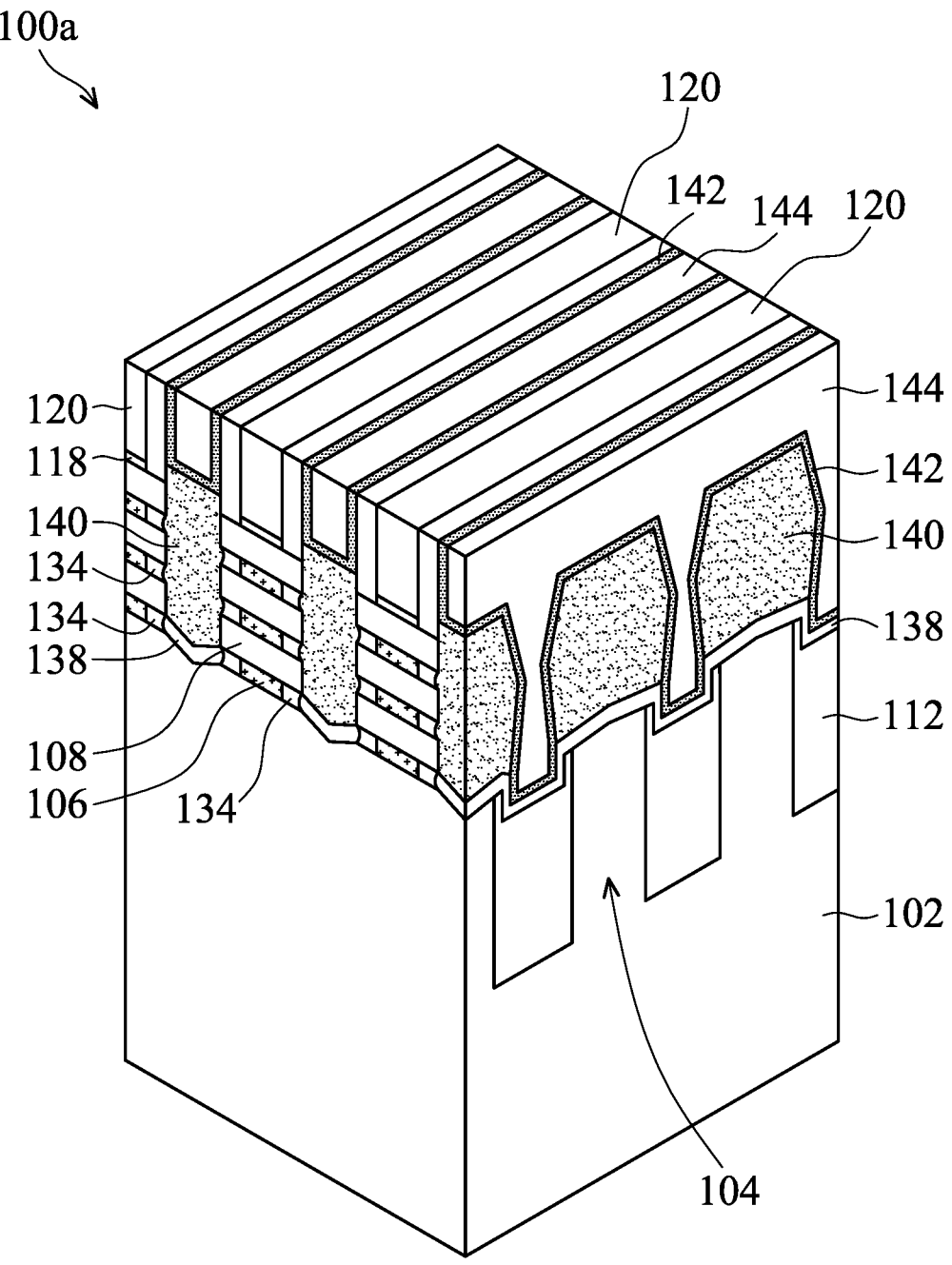
Figure 1M:
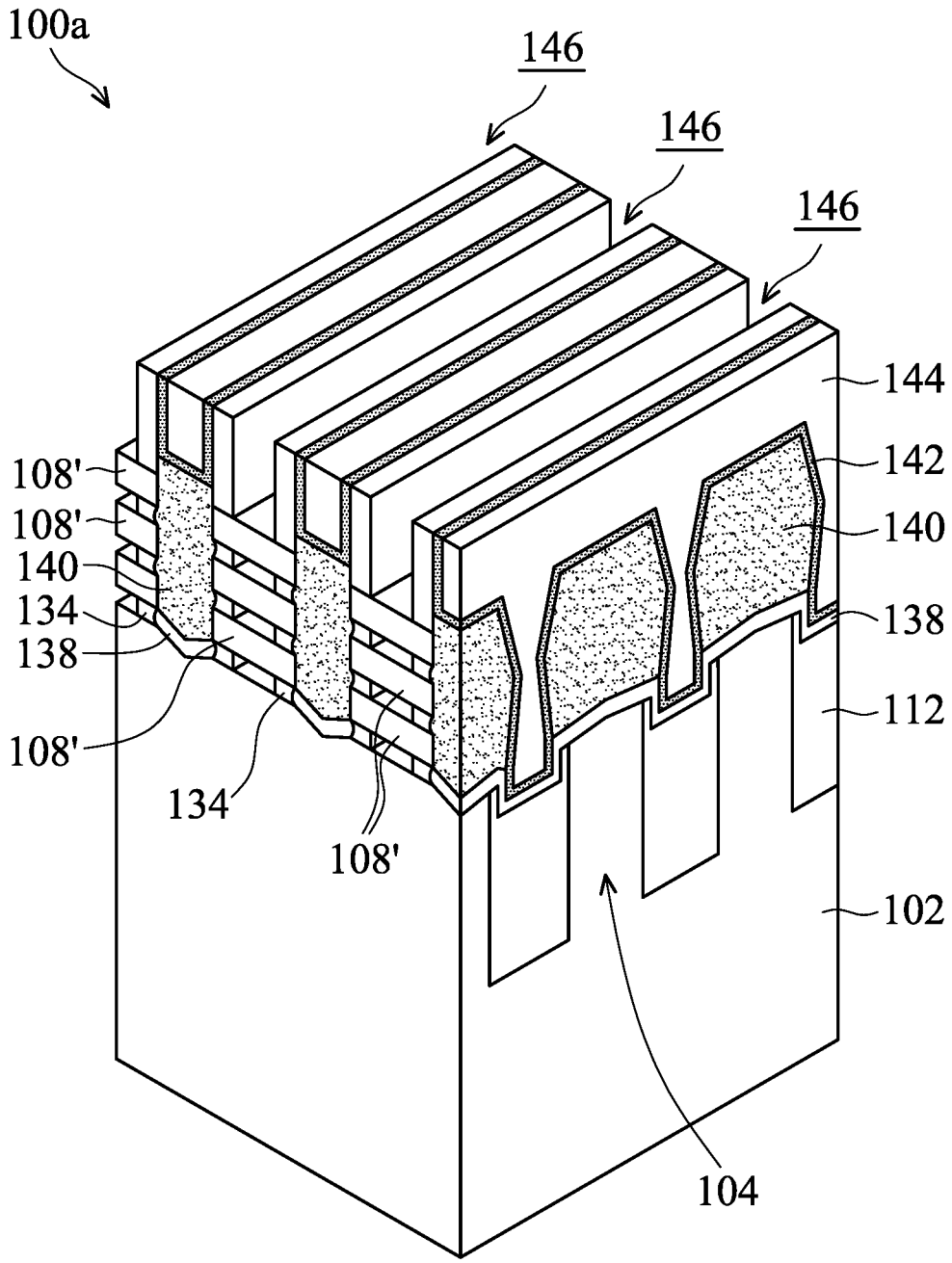

Next, as shown in FIG. 1L, after the CESL 142 and the ILD layer 144 are deposited, a portion of the ILD layer 144 is removed by a planarization process, in accordance with some embodiments. In some embodiments, the planarization process such as CMP or an etch-back process is performed until the gate electrode layers 120 of the dummy gate structures 116 are exposed Next, as shown in FIG. 1M, the dummy gate structures 116 and the first semiconductor material layers 106 of the fin structures 104 are removed to form gate trenches 146, in accordance with some embodiments. More specifically, the dummy gate structures 116 and the first semiconductor material layers 106 of the fin structures 104 are removed to form nanostructures 108' with the second semiconductor material layers 108 of the fin structures 104, in accordance with some embodiments.

The removal process may include one or more etching processes. For example, when the dummy gate electrode layers 120 are polysilicon, a wet etchant such as a tetramethylammonium hydroxide (TMAH) solution may be used to selectively remove the dummy gate electrode layers 120. Afterwards, the dummy gate dielectric layers 118 may be removed using a plasma dry etching, a dry chemical etching, and/or a wet etching. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Figure 1N:
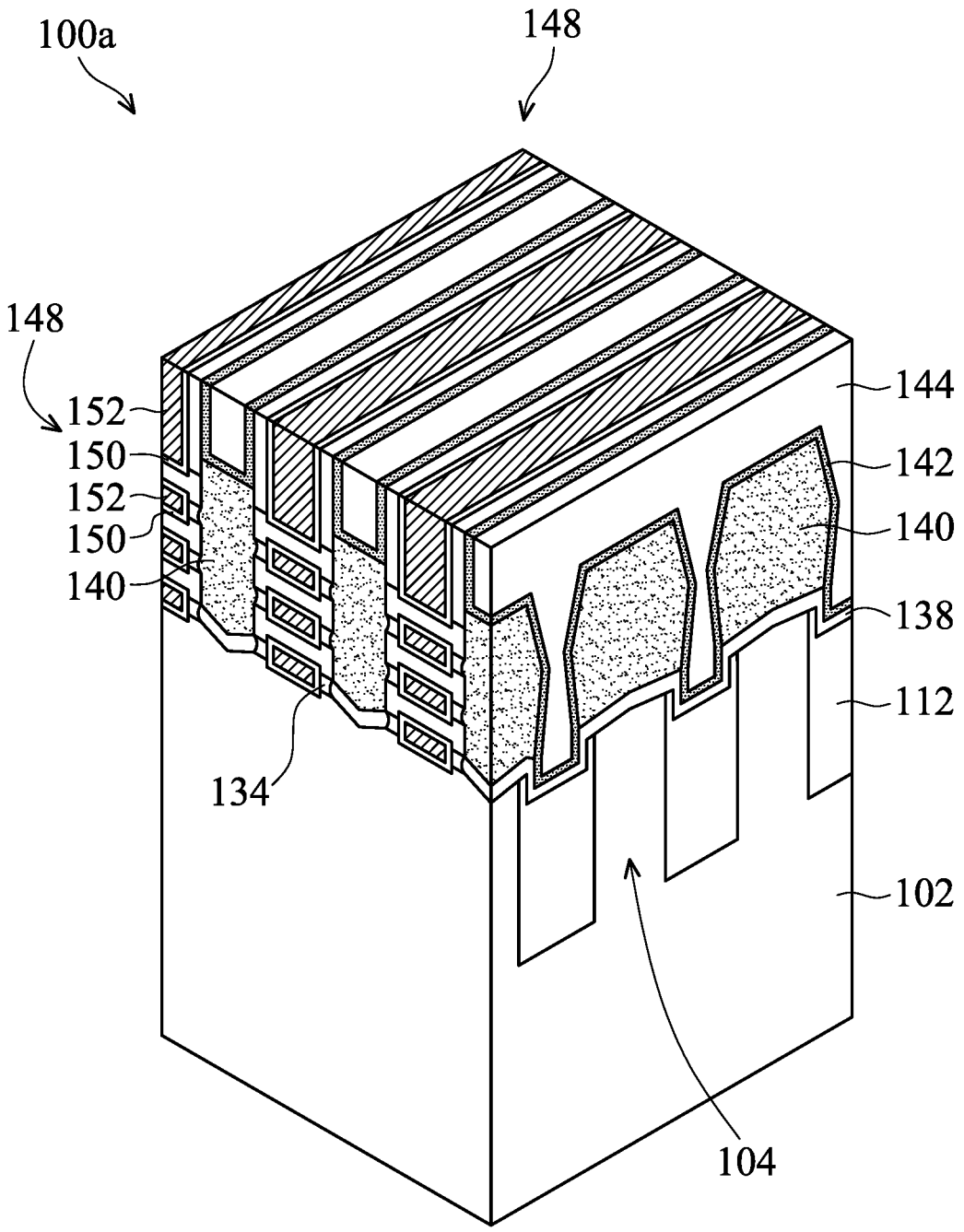

Next, as shown in FIG. 1N, gate structures 148 are formed wrapping around the nanostructures 108', in accordance with some embodiments. The gate structures 148 wrap around the nanostructures 108' to form gate-all-around transistor structures, in accordance with some embodiments. In some embodiments, the gate structures 148 include conductive materials such as Ti, TiN, and/or W with dopants such as La, Zr, Hf, or the like.

In some other embodiments, a trimming process is performed before the formation of the gate structures 148, so that the nanostructures 108' at the channel region wrapped by the gate structures 148 are narrower than the nanostructures under the gate spacers 128 and between the inner spacers 134.

In some embodiments, each of the gate structure 148 includes a gate dielectric layer 150 and a gate electrode layer 152. In some embodiments, an interfacial layer is formed before the gate dielectric layer 150 is formed, although not shown in FIG. 1Q.

In some embodiments, the interfacial layer is an oxide layer formed around the nanostructures 108' and on the exposed portions of the base fin structures 105. In some embodiments, the interfacial layer is formed by performing a thermal process.

In some embodiments, the gate dielectric layer 150 is formed over the interfacial layer, so that the nanostructures 108' are surrounded (e.g. wrapped) by the gate dielectric layer 150. In addition, the gate dielectric layer 150 also covers the sidewalls of the gate spacers 128, the inner spacers 134, and the nanostructures 108' in accordance with some embodiments.

In some embodiments, the gate dielectric layers 150 are made of one or more layers of dielectric materials, such as ZrAlO, TiO, TaO, ZrO, LaO, HfO, LaO, AlO, YO, ZnO, HZO, HfSiO, HfSiON, HfTaO, HfTiO, HfZrO, hafnium dioxide-alumina ($HfO_2$—$Al2O_3$) alloy, other applicable high-k dielectric materials, or a combination thereof. In some embodiments, the gate dielectric layers 150 are formed using CVD, ALD, other applicable methods, or a combination thereof. In some embodiments, the gate dielectric layers 150 has a thickness in a range from about 0.5 nm to about 5 nm.

In some embodiments, the gate electrode layers 152 are formed on the gate dielectric layers 150. In some embodiments, the gate electrode layers 152 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 152 are formed using CVD, ALD, electroplating, another applicable method, or a combination thereof. Other conductive layers, such as work function metal layers, may also be formed in the gate structures 148, although they are not shown in the figures.

Figure 1O:
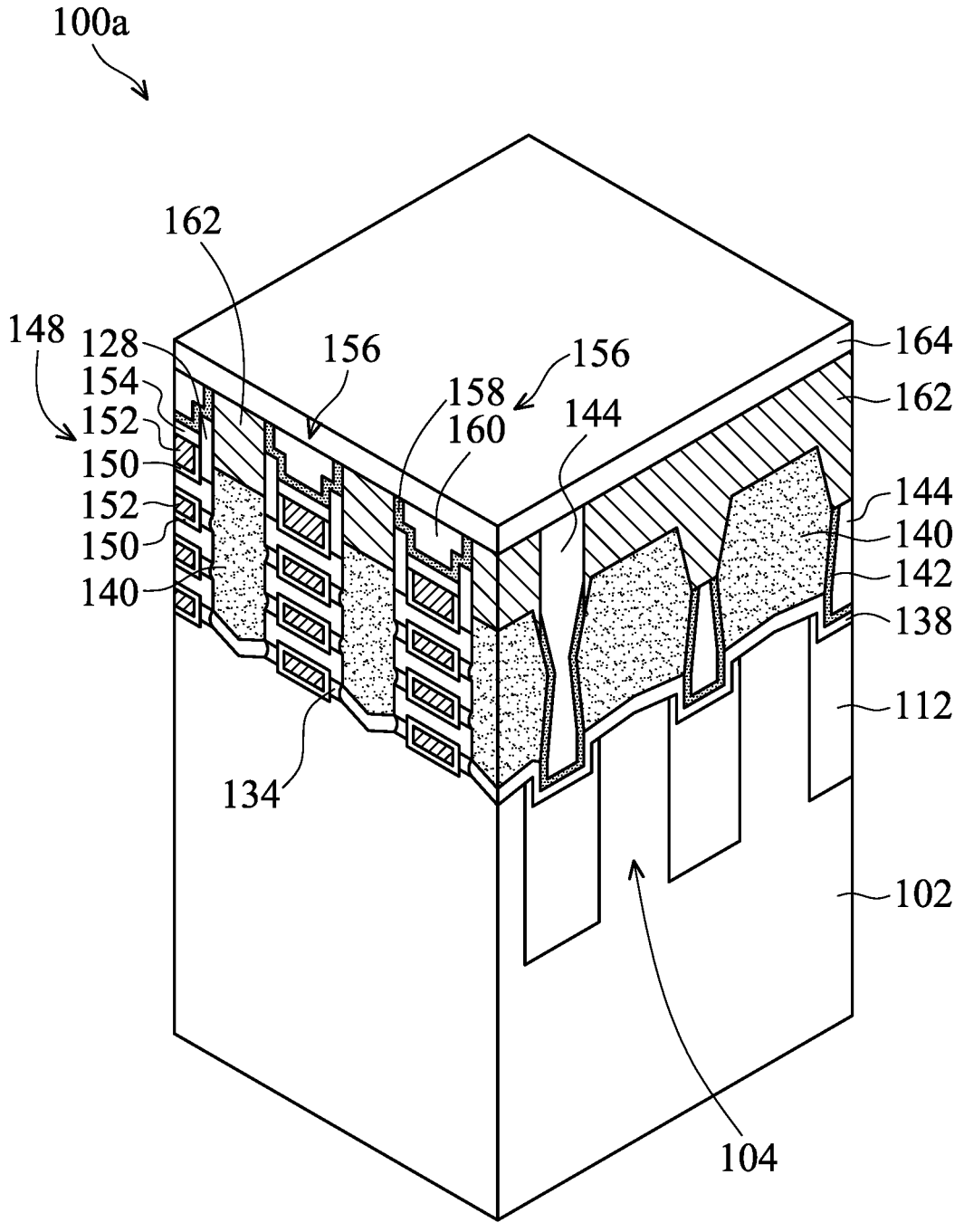

Next, as shown in FIG. 1O, after the gate structures 148 are formed, an etch back process is performed to form recesses over the gate structures 148, and metal cap layers 154 and mask structures 156 are formed in the recesses, in accordance with some embodiments.

In some embodiments, an etching process is performed to form the recesses. In some embodiments, the etching process is an isotropic etching such as dry chemical etching, remote plasma etching, wet chemical etching, another suitable technique, and/or a combination thereof. In some embodiments, the gate spacers 128 are partially removed during the etching process, so that the recesses have T shape in the cross-sectional views.

After the recesses are formed, the metal cap layers 154 are formed over the top surfaces of the gate structures 148 in accordance with some embodiments. In some embodiments, the metal cap layers 154 are made of metal such as W, Re, Ir, Co, Ni, Ru, Mo, Al, Ti, Ag, Al, other applicable metals, or multilayers thereof. In some embodiments, the metal cap layers 154 and the metal gate electrode layer 152 are made of different materials. In some embodiments, the metal cap layers 154 covers both the gate dielectric layers 150 and the gate electrode layers 152 and are in contact with the sidewalls of the gate spacers 128. In some embodiments, the top surfaces of the metal cap layers 154 are lower than the top portions of the gate spacers 128.

After the metal cap layers 154 are formed, the mask structures 156 are formed in the recesses over the metal cap layers 154 and over the gate spacers 128, in accordance with some embodiments. In some embodiments, the mask structures 156 are bi-layered structure including a lining layer 158 and a bulk layer 160 over the lining layer 158. The mask structures 156 are configured to protect the gate spacer 128 and the gate structures 148 during the subsequent etching process for forming contact plugs.

In some embodiments, the mask structures 156 have narrower bottom portions and wider top portions. In some embodiments, the mask structures 156 have T-shapes in cross-sectional views. In some embodiments, the mask structures 156 are in direct contact with the contact etch stop layers 142.

In some embodiments, the lining layer 158 is made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide (SiO2), or a combination thereof. In some embodiments, the dielectric material for forming the lining layer 158 is conformally deposited using such as ALD, CVD (such as LPCVD, PECVD, HDP-CVD, or HARP), or the like.

In some embodiments, the bulk layer 160 is made of dielectric material such as silicon oxide (SiO2), silicon nitride (SiN), silicon oxynitride (SiON), silicon carbon nitride (SiCN), silicon oxycarbonitride (SiOCN), oxygen-doped silicon carbonitride (Si(O)CN), or a combination thereof. In some embodiments, the dielectric material for the bulk layer 160 is formed over the lining layer 158 to overfill the recesses using such as CVD (such as FCVD, LPCVD, PECVD, HDP-CVD or HARP), ALD, or the like. In some embodiments, the bulk layer 160 and the lining layer 158 are made of different materials. In some embodiments, the bulk layer 160 is made of an oxide (such as silicon oxide) and the lining layer 158 is made of a nitrogen-containing dielectric (such as silicon nitride or silicon oxynitride). Afterward, a planarization process is performed on the bulk layer 160 and the lining layer 158 until the ILD layer 144 is exposed. The planarization may be CMP, an etching back process, or a combination thereof.

After the mask structures 156 are formed, front side source/drain (S/D) contact structure 162 are formed through the ILD layer 144 and the CESL 142 over the S/D structures 140. In some embodiments, some of the front side source/drain (S/D) contact structures 162 overlap more than one of the fin structures 104. The formation of the front side S/D contact structure 162 may include patterning the ILD layer 144 and the CESL 142 to form contact openings partially exposing the S/D structures 140, forming a silicide layer (not shown), and forming a conductive material over the silicide layer.

The patterning process may include forming a patterned mask layer using a photolithography process over the ILD layer 144 followed by an anisotropic etching process.

The silicide layers may be formed by forming metal layers over the top surface of the S/D structures 140 and annealing the metal layers so the metal layers react with the S/D structures 140 to form the silicide layers. The unreacted metal layers may be removed after the silicide layers are formed. The silicide layers may be made of WSi, NiSi, TiSi, TaSi, PtSi, WSi, CoSi, or the like.

After the silicide layer is formed, the conductive material may be formed in the contact openings to form the front side S/D contact structure 162. The conductive material may include ruthenium (Ru), cobalt (Co), copper (Cu), titanium (Ti), titanium nitride (TiN), tantalum (Ta), tantalum nitride (TaN), molybdenum (Mo), nickel (Ni), aluminum (Al) tungsten (W), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

In some embodiments, the conductive material for forming the front side S/D contact structure 162 is different from that for forming the gate structures. The conductive material may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Liners and/or barrier layers (not shown) may be formed before the formation of the conductive materials of the front side S/D contact structure 162. The liners may be made of silicon nitride, although any other applicable dielectric may be used as an alternative. The barrier layer may be made of tantalum nitride, although other materials, such as tantalum, titanium, titanium nitride, or the like, may also be used.

As shown in FIG. 1O, after the front side S/D contact structure 162 are formed, a front end structure 164 is formed over the mask structures 156, the ILD layer 144, and the front side S/D contact structure 162, and a carrier substrate (not shown) is formed over the front end structure 164, in accordance with some embodiments.

In some embodiments, the front end structure 164 includes an etch stop layer and various features (not shown), such as a multilayer interconnect structure (e.g., contacts to gate, vias, lines, inter metal dielectric layers, passivation layers, etc.), formed thereon.

Figure 1P:
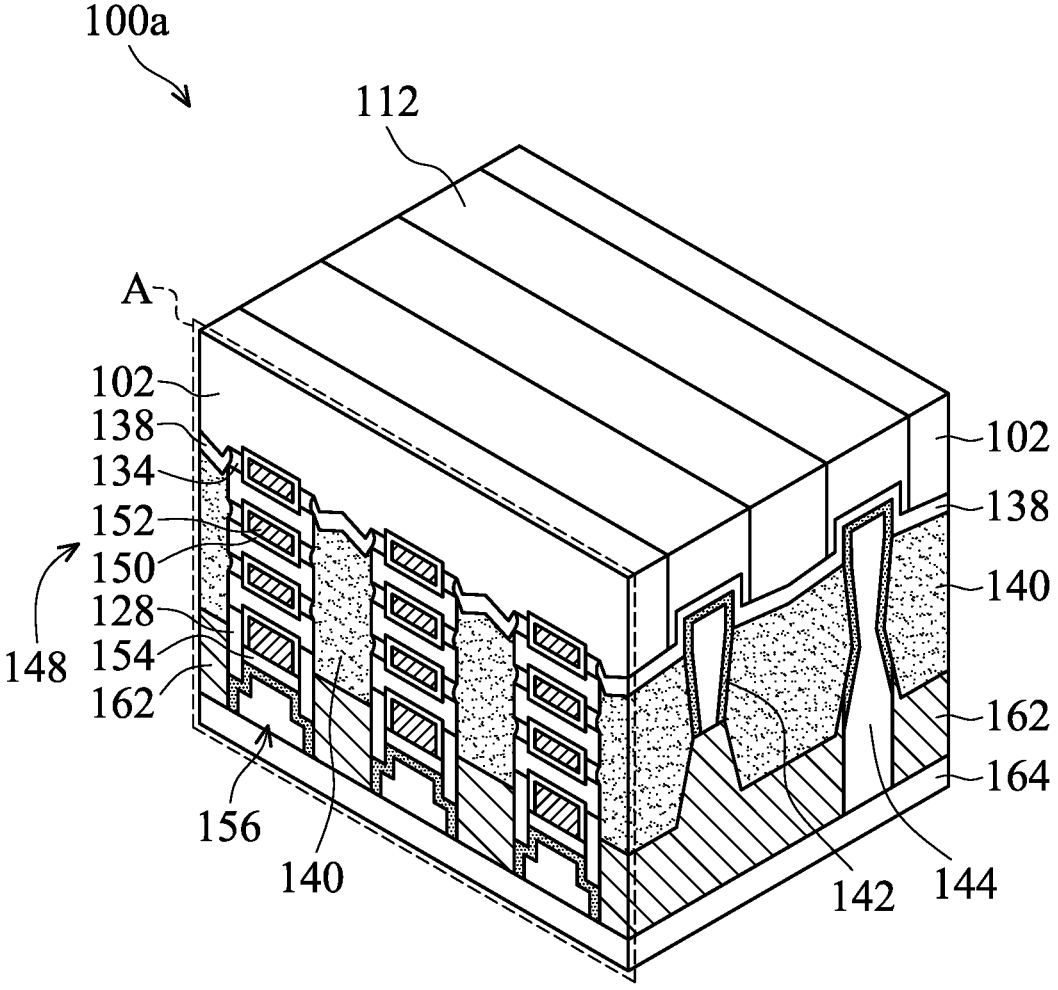
Figure 1Q:
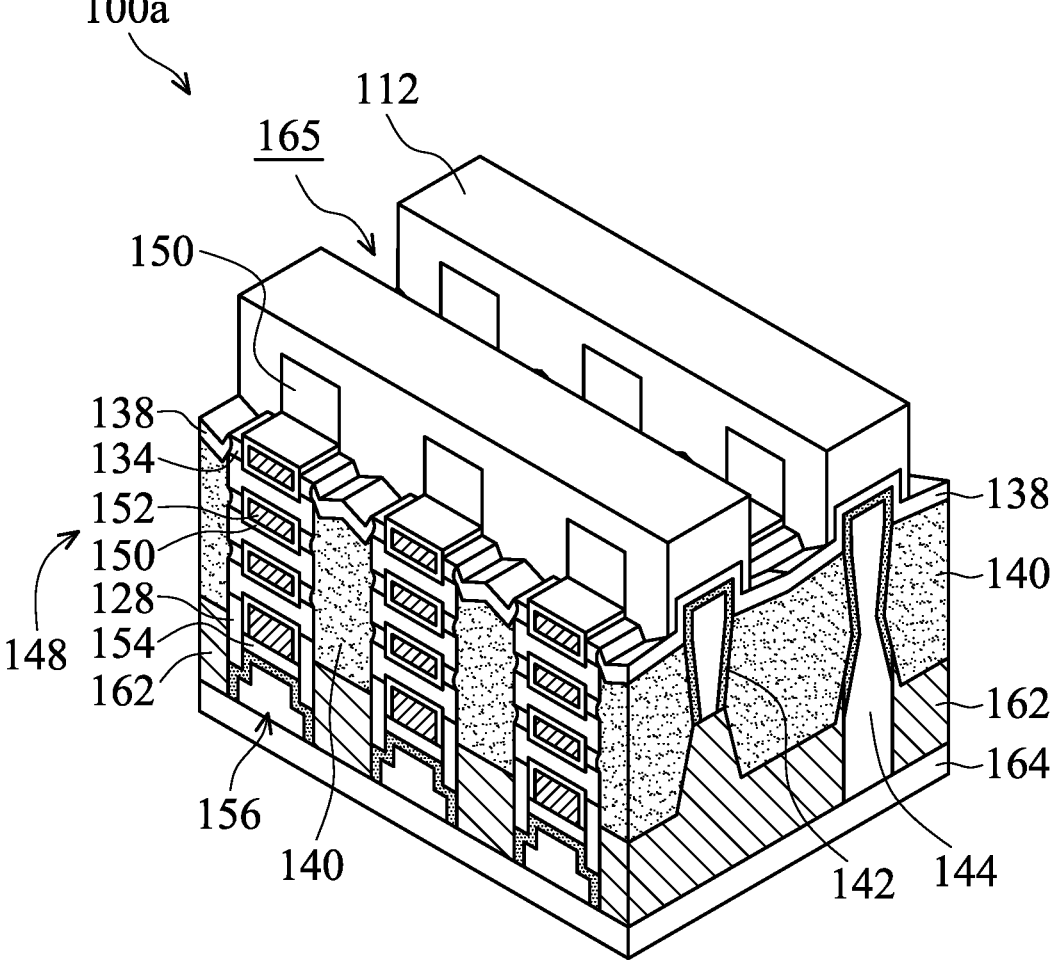
Figure 1R:
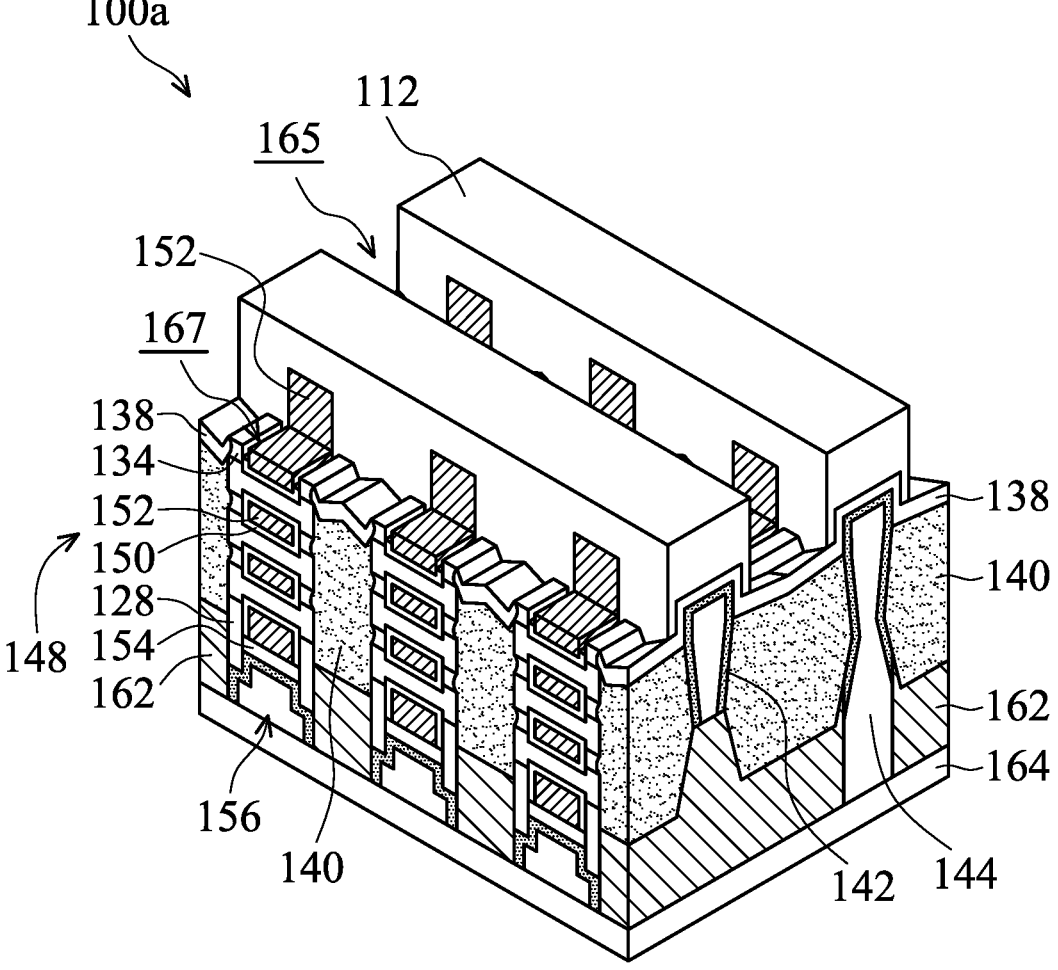
Figure 1S:
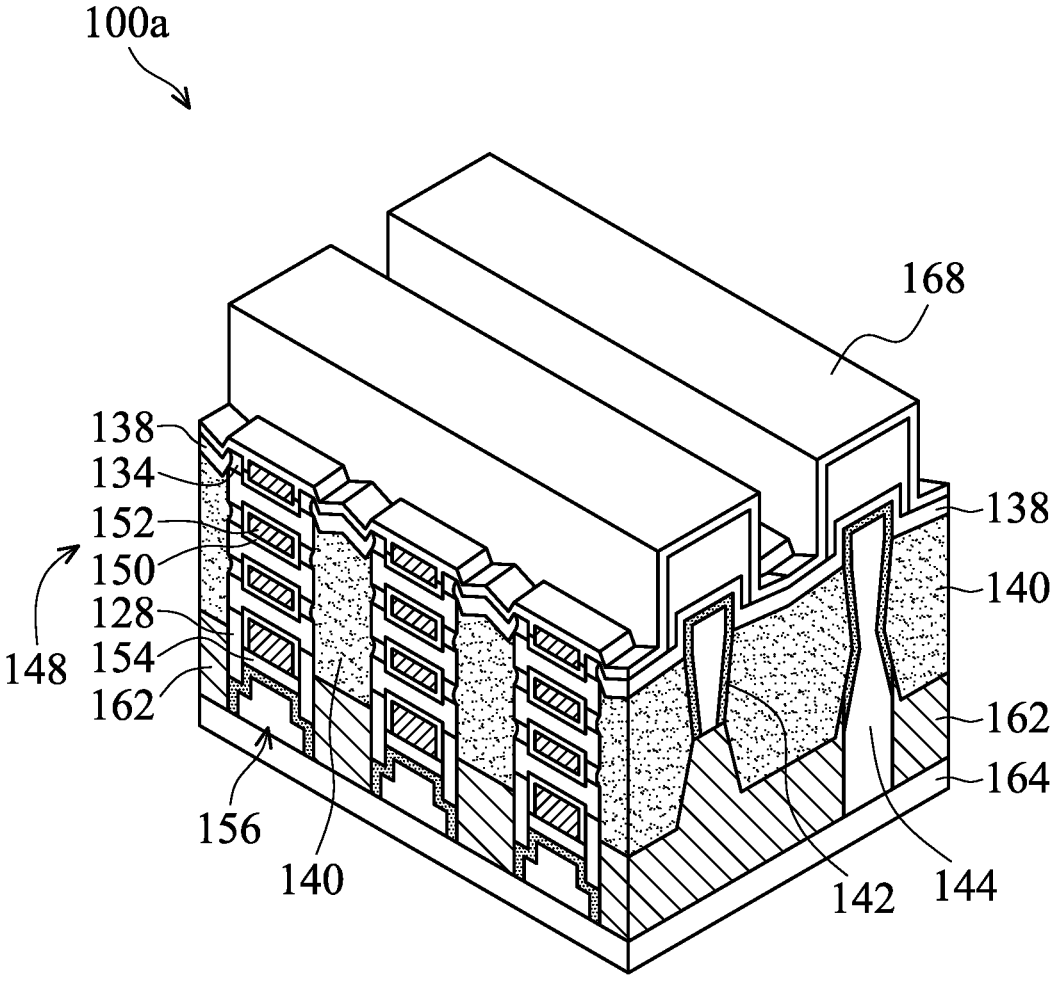
Figure 1T:
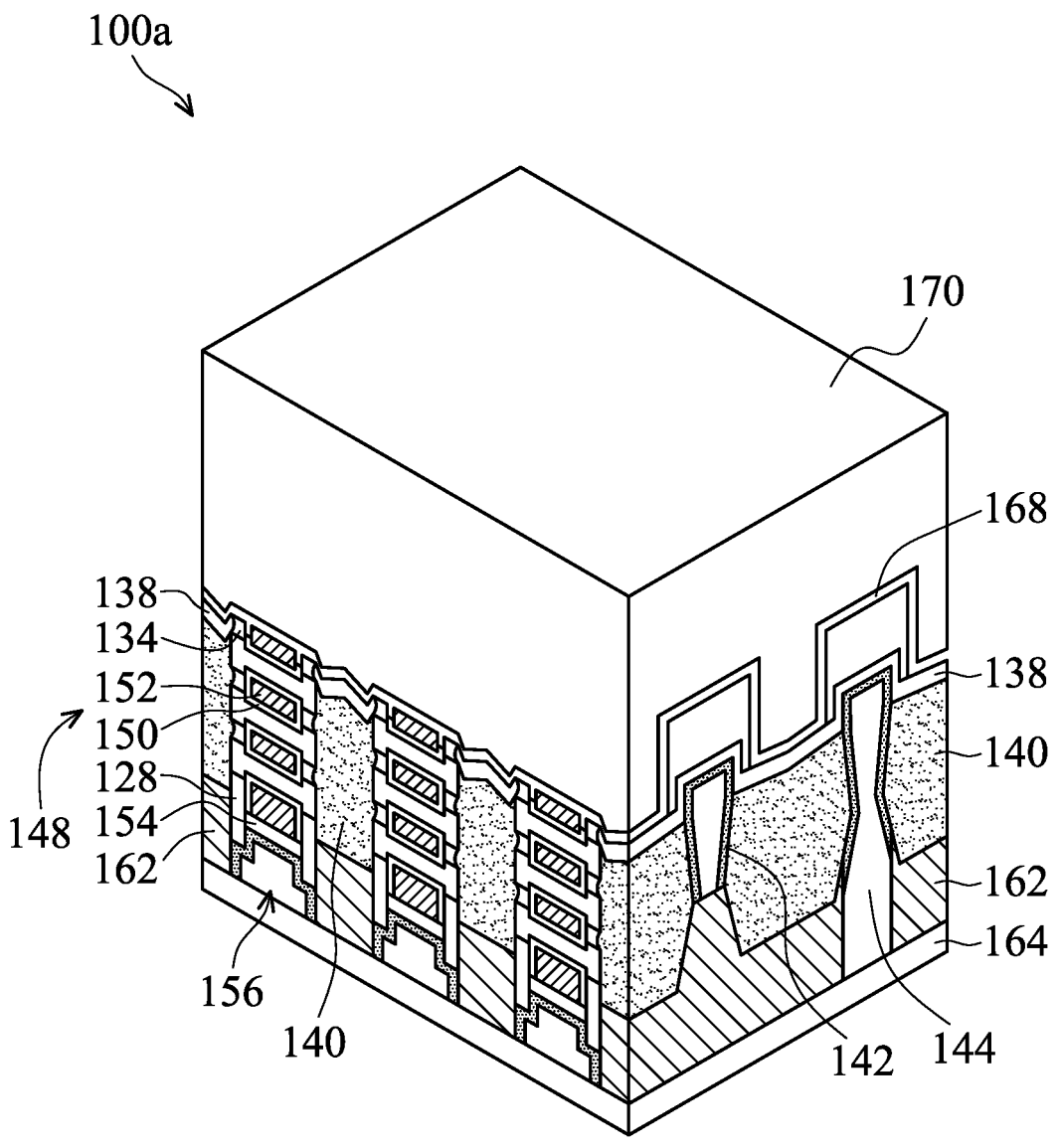
Figure 1U:
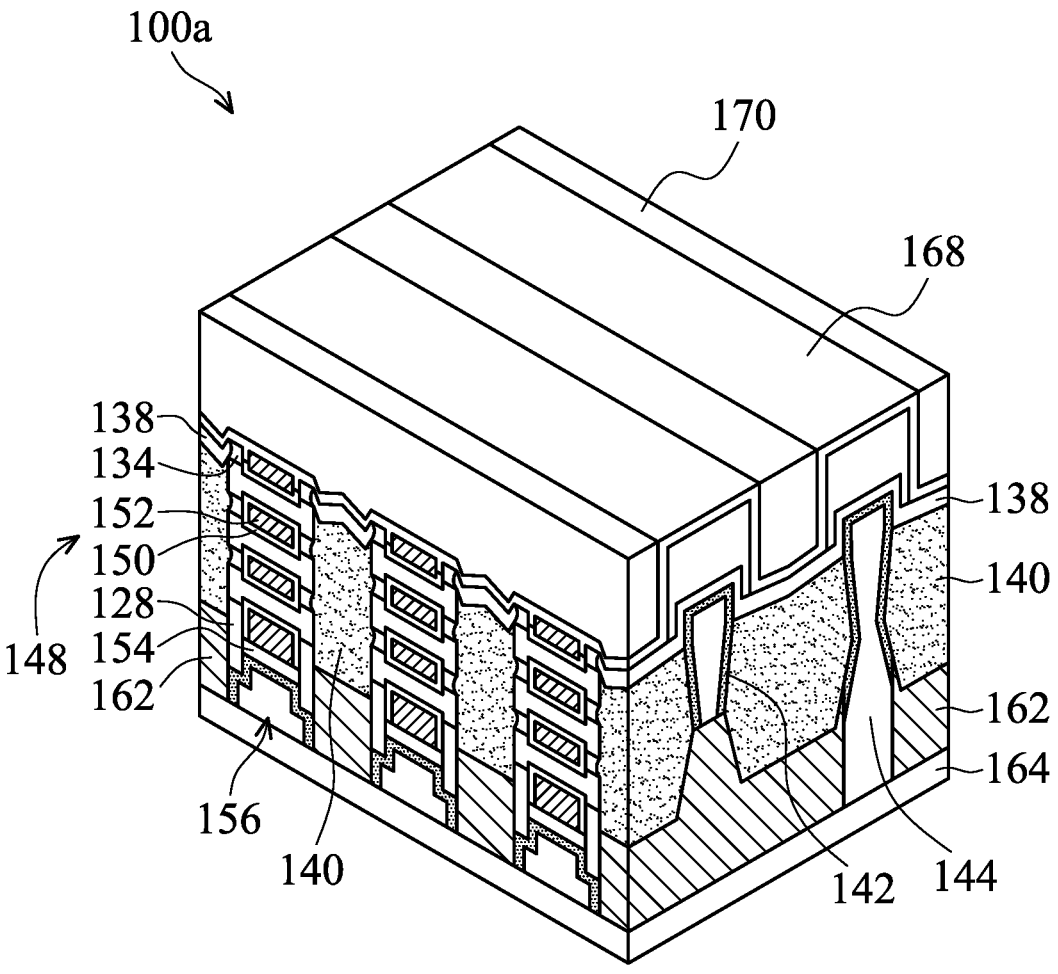
Figure 1V:
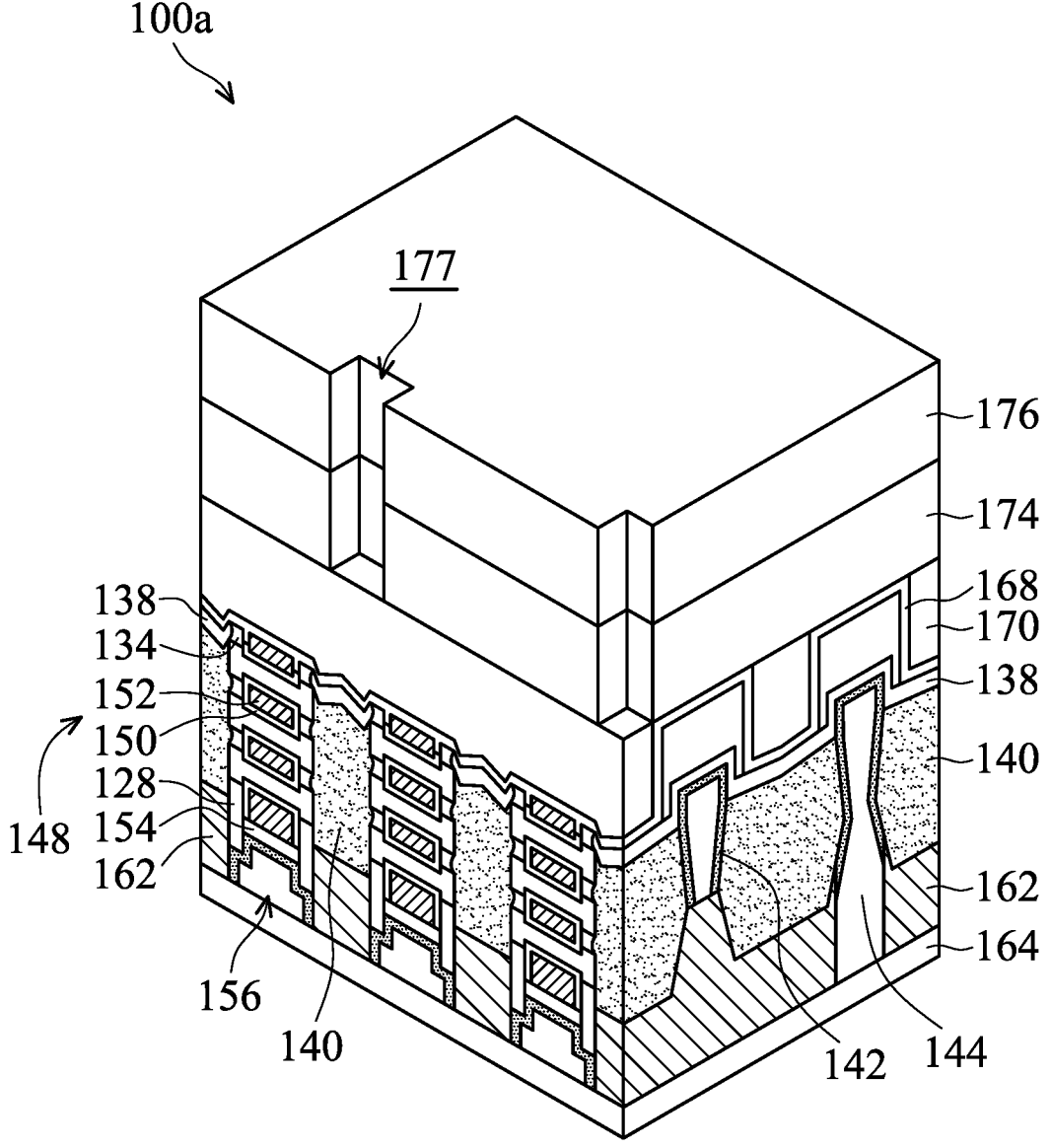
Figure 1W:
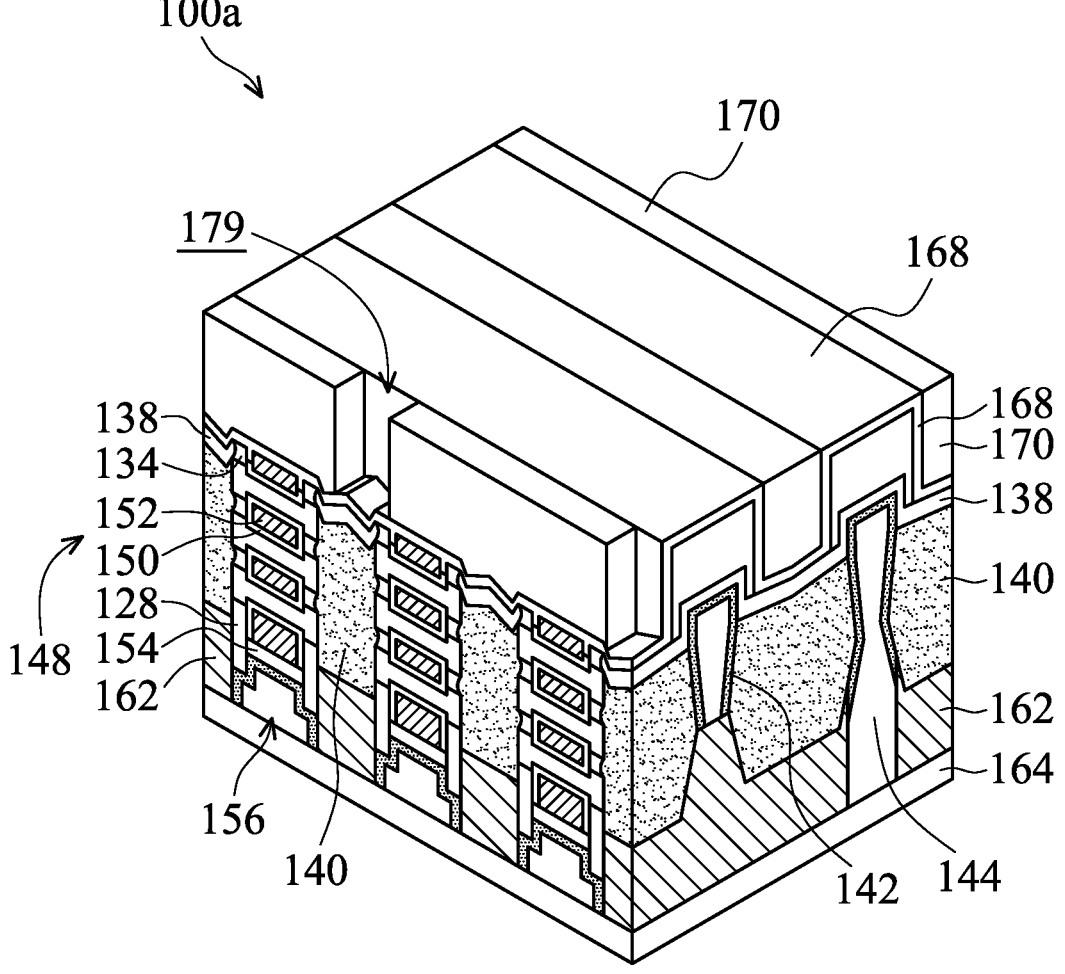
Figure 1X:
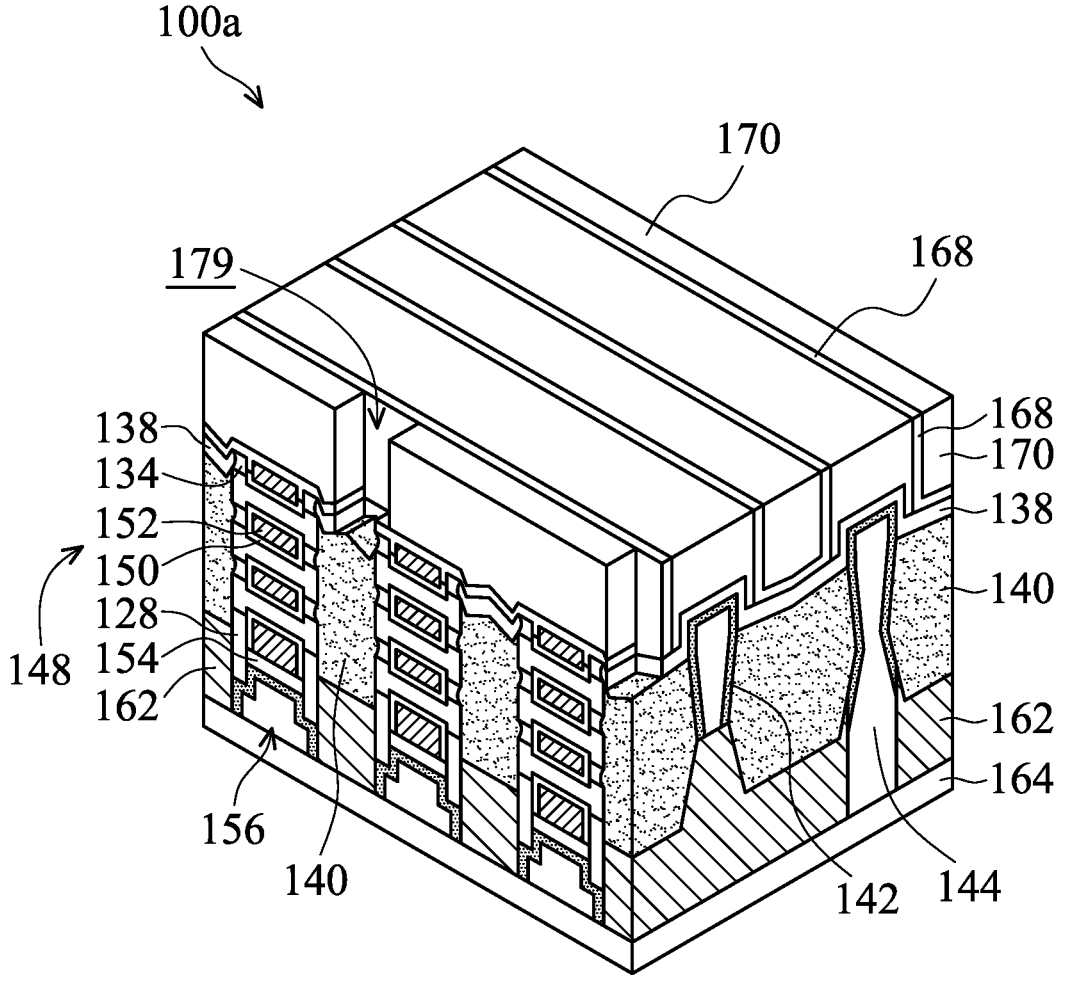
Figure 1Y:
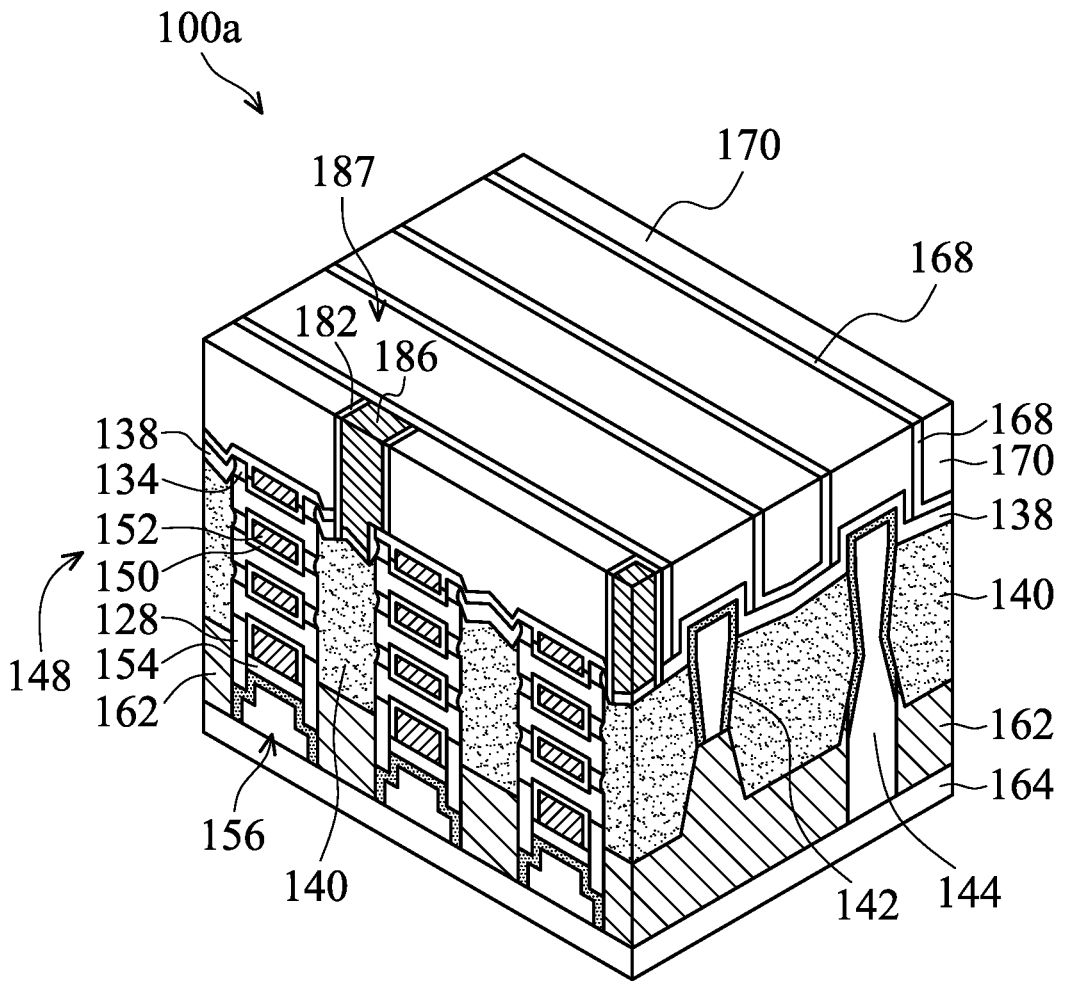
Figure 2A:
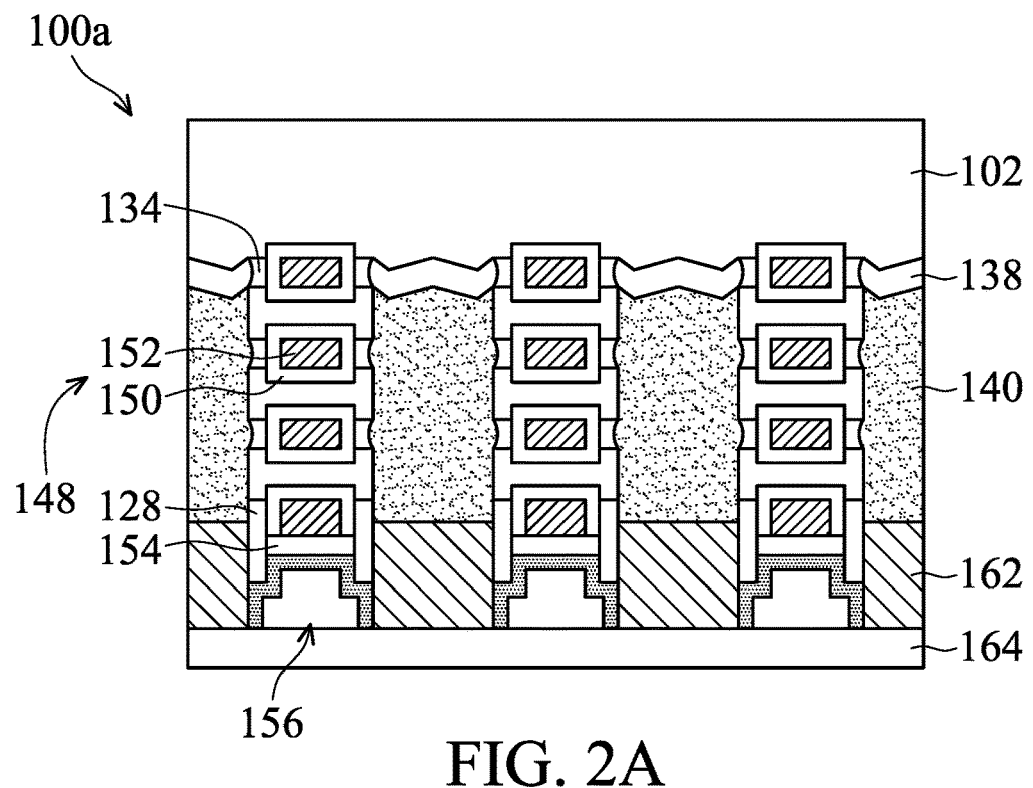
FIGS. 2A-2J show cross-sectional representations of various stages of manufacturing the semiconductor structure shown in region A in FIGS. 1P-1Y, in accordance with some embodiments.

FIG. 2A shows an enlarged cross-sectional view of the semiconductor structure 100a of region A of FIG. 1P, in accordance with some embodiments. FIGS. 2A-2J show cross-sectional representations of various stages of manufacturing the semiconductor structure 100a shown in region A in FIGS. 1P-1Y, in accordance with some embodiments.

Next, as shown in FIGS. 1P and 2A, after the front end structure 164 is formed, a carrier substrate (not shown) is attached to the front end structure 164, and then the substrate 102 is turned upside down, and a planarization is performed on the back side of the substrate 102, in accordance with some embodiments. More specifically, a planarization is performed on the substrate 102 until the isolation structure 112 are exposed.

The planarization process may be an etching process, a CMP process, a mechanical grinding process, a dry polishing process, or a combination thereof. The front end structure 164 is configured to support the semiconductor structure in subsequent manufacturing process.

It is appreciated that although the structures in FIGS. 1P-1Y are shown in upside down for better understanding the manufacturing processes, the spatial positions of the elements (e.g. top portions, bottom portions, topmost, bottommost, or the like) are described according to the original positions shown in FIGS. 1A to 1O so they can be in consistence with those described previously for clarity. For example, the front side surface of the S/D structure 140 is referred to the surface in contact with the S/D contact structure 162, and the back side surface of the S/D structures 140 is referred to the surface in contact with the dielectric layer 138, since the structure shown in FIG. 1P is upside down.

Figure 2B:
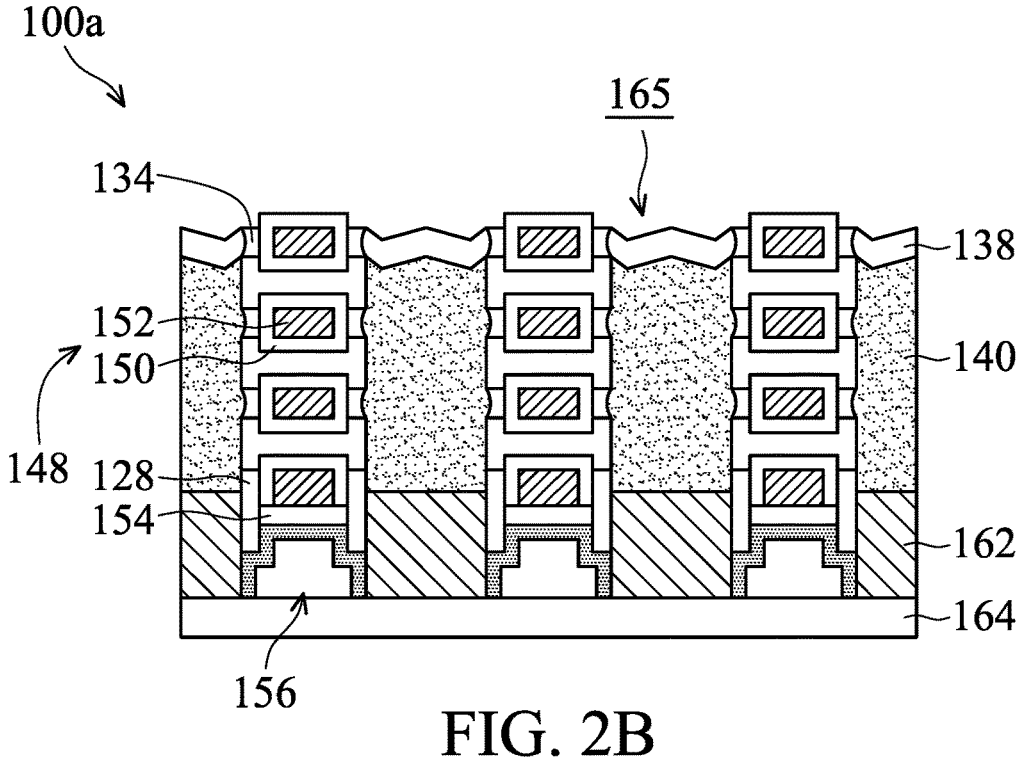

Next, as shown in FIGS. 1Q and 2B, the substrate 102 is removed to form a recess 165, in accordance with some embodiments. As a result, the dielectric layer 138 is exposed by the recess 165. In addition, a portion of the gate dielectric layer 150 is exposed by the recess 167. The dielectric layer 138 is configured as a protection layer or a stop layer and is not removed to protect the S/D structure 140 when the substrate 102 is removed.

In some embodiments, the substrate 102 is removed by dry etching process. In some embodiments, the substrate 102 is made of Si, and the isolation structure 112 is made of silicon oxide. Since the isolation structure 112 has a high etching selectivity with respect to the substrate 102, the substrate 102 is removed while the isolation structure 112 is left.

Figure 2C:
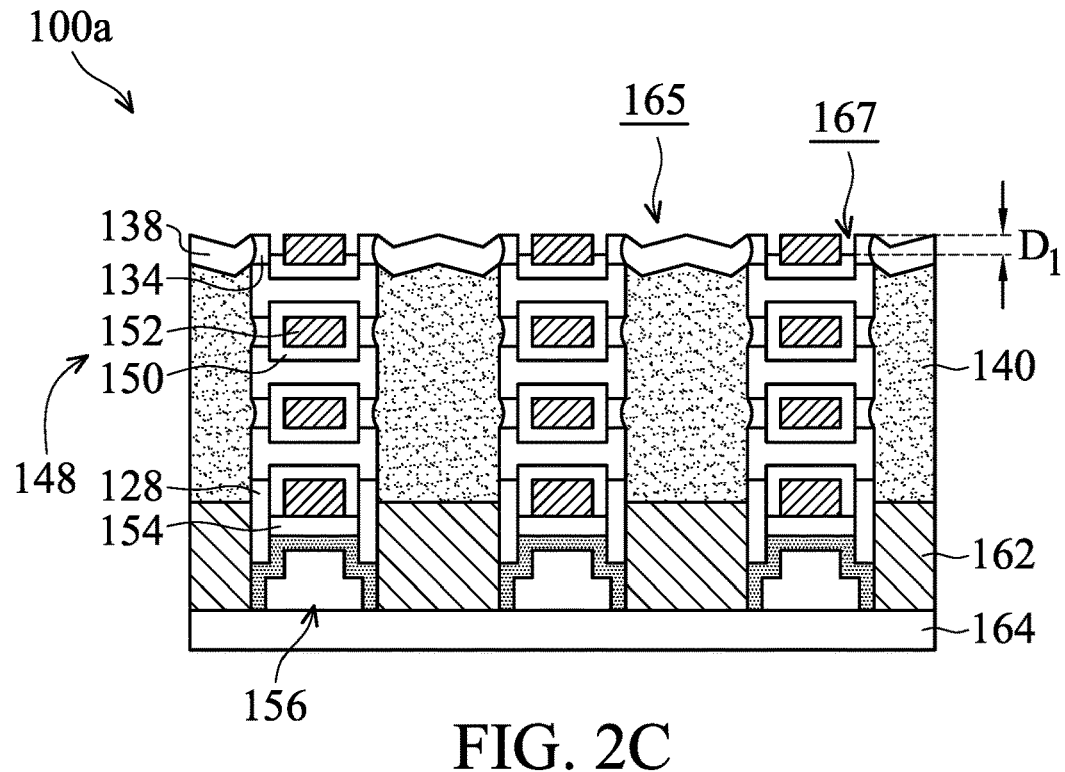

Afterwards, as shown in FIGS. 1R and 2C, a portion of the gate dielectric layer 150 is removed to form a recess 167, in accordance with some embodiments. More specifically, the top portion of the gate dielectric layer 150 is removed. The recess 167 is a space which is surrounded by the gate dielectric layer 150, the dielectric layer 138 and the gate electrode layer 152. The top surface of the sidewall surfaces of the gate electrode layer 152 are exposed by the recess 167. As a result, the topmost surface of the gate dielectric layer 150 is lower than the topmost surface of the gate electrode layer 152. In addition, the topmost surface of the gate dielectric layer 150 is lower than the topmost surface of the dielectric layer 138. The topmost surface of the gate dielectric layer 150 is substantially level with or higher than the topmost surface of the S/D structure 140.

The bottom surface of the recess 167 is lower than the topmost surface of the gate electrode layer 152. It should be noted that the gate dielectric layer 150 is not completely removed. The bottom portion of the gate dielectric layer 150 is still left to surround the bottom portion of the gate electrode layer 152. If the gate dielectric layer 150 is completely removed, the gate electrode layer 152 may peel. The recess 167 has a first depth $D_1$. In some embodiments, the first depth $D_1$ is in a range from about 2 nm to about 10 nm.

Figure 2D:
Figure 2D:
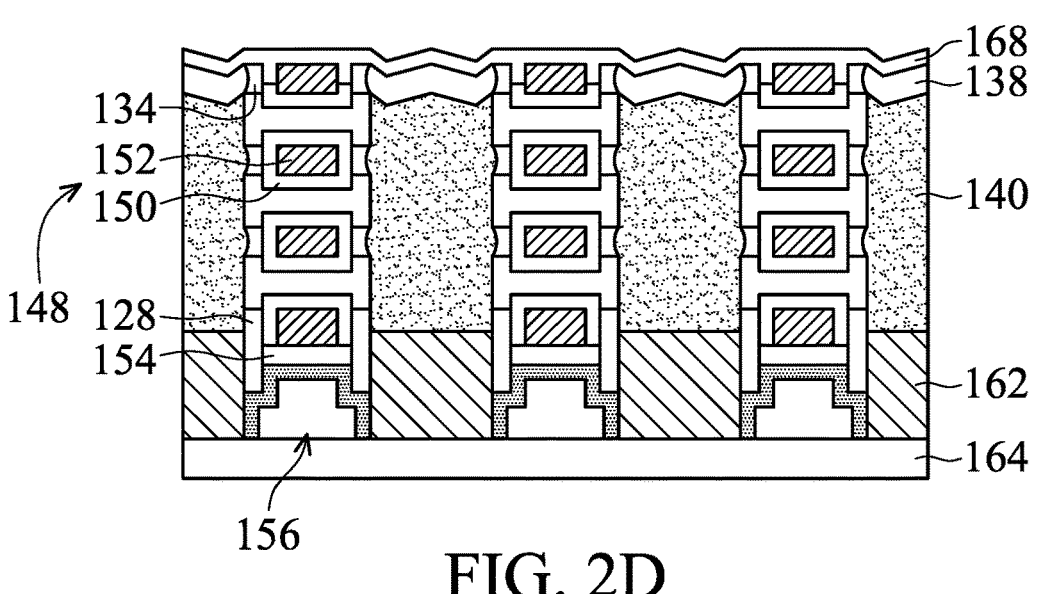

Afterwards, as shown in FIGS. 1S and 2D, a filling layer 168 is formed in the recess 167 and on the inner spacer layer 134 and the dielectric layer 138, in accordance with some embodiments. The filling layer 168 is configured to increase the isolation between the gate electrode layer 152 and the back side S/D contact structure 187 (formed later). In addition, the filling layer 168 is used as a barrier layer to protect the gate electrode layer 152 from being oxidized by the dielectric layer 170 (formed later).

The filling layer 168 has a protrusion portion embedded in a space, and the space is surrounded by the inner spacer 134, the gate dielectric layer 150 and the gate electrode layer 152. The filling layer 168 is in direct contact with the inner spacer 134 and the dielectric layer 138.

The filling layer 168 and the dielectric layer 138 are made of different materials, and the interface between the filling layer 168 and the dielectric layer 138 is lower than the topmost surface of the gate electrode layer 152.

In some embodiments, the dielectric constant (k value) of the filling layer 168 is smaller than the dielectric constant (k value) of the gate dielectric layer 150. The filling layer 168 has a better isolation ability than the gate dielectric layer 150.

In some embodiments, the filling layer 168 is made of SiN, SiCN, SiOCN, SiOC, SiC or another applicable material. In some embodiments, the filling layer 168 is formed by a deposition process, such as chemical vapor deposition (CVD), physical vapor deposition, (PVD), atomic layer deposition (ALD), or another applicable process.

Figure 2E:
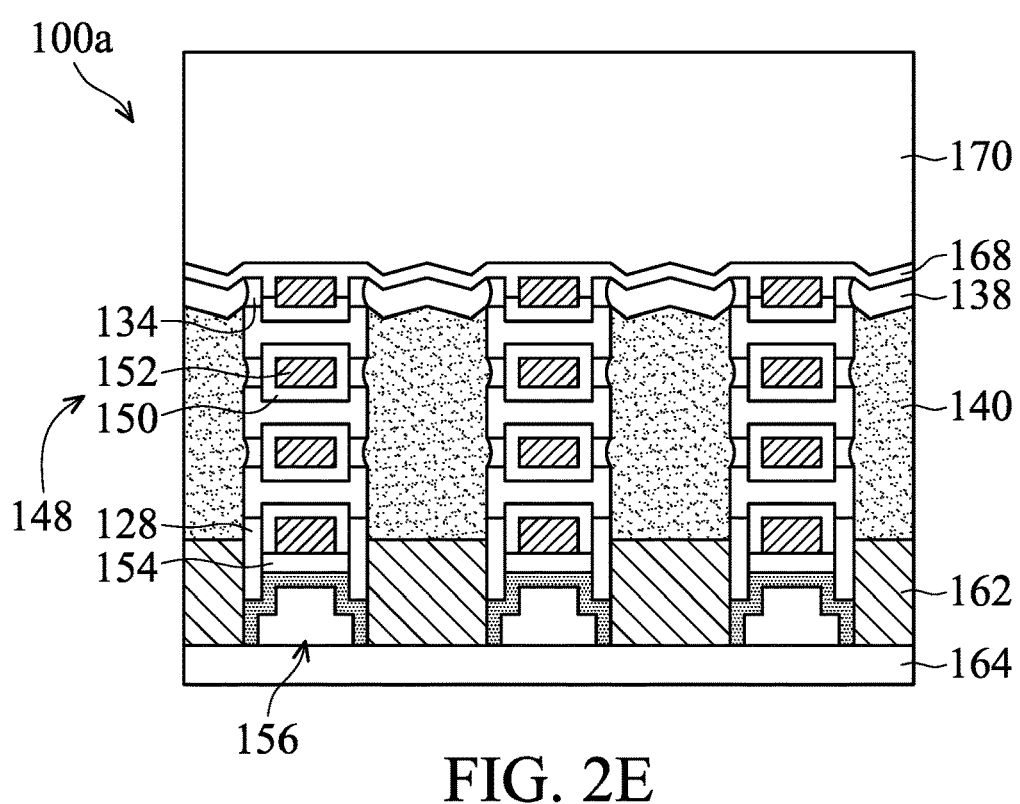

Next, as shown in FIGS. 1T and 2E, a dielectric layer 170 is formed over the filling layer 168, in accordance with some embodiments. The dielectric layer 170 and the filling layer 168 are made of different materials, and therefore the filling layer 168 is used as a barrier layer to protect the gate electrode layer 152 from being oxidized by the dielectric layer 170.

In some embodiments, the dielectric layer 170 is made of silicon oxide, and the filling layer 168 is made of silicon nitride. In some embodiments, the dielectric layer 170 is made of SiCN, SiO, SiCON, SiN, or another applicable material. In some embodiments, the dielectric layer 170 is formed by a deposition process, such as chemical vapor deposition (CVD), physical vapor deposition, (PVD), atomic layer deposition (ALD), or another applicable process. In some embodiments, the dielectric layer 170 has a thickness in a range from about 0.5 nm to about 6 nm.

Figure 2F:
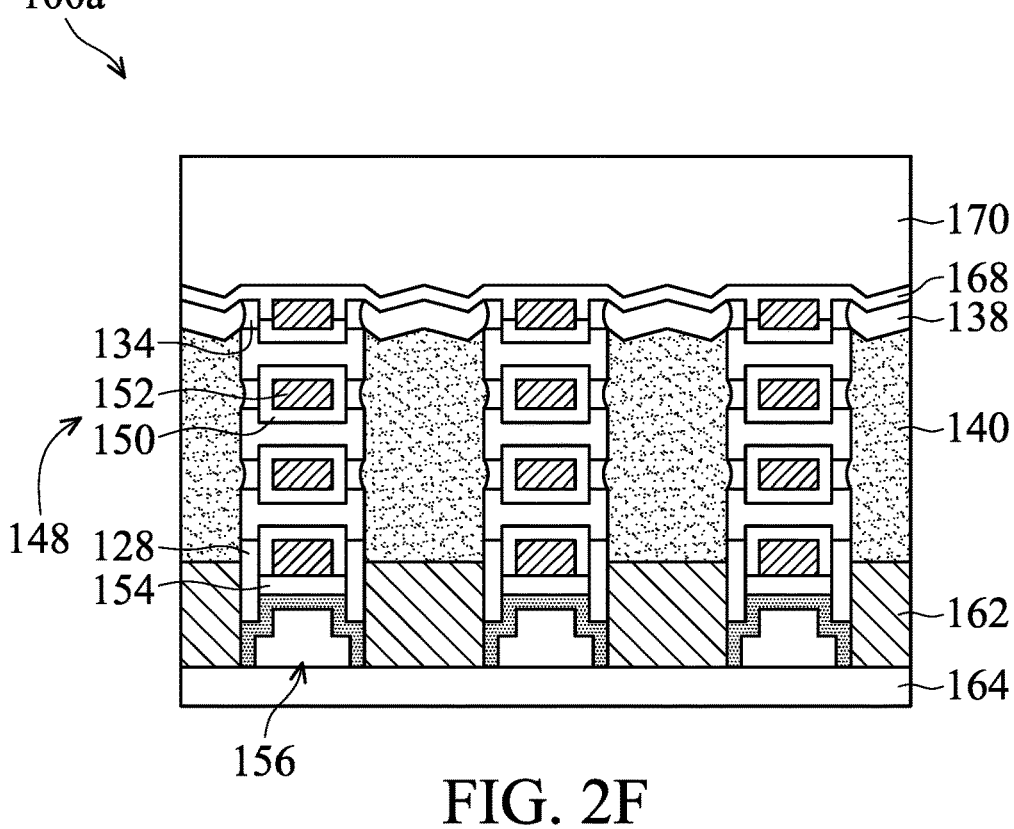

Next, as shown in FIGS. 1U and 2F, a polishing process (e.g. CMP) is performed on the dielectric layer 170 until the filling layer 168 is exposed, in accordance with some embodiments. The dielectric layer 170 and the filling layer 168 are made of different materials, and the polishing removal rate (or CMP removal rate) of the dielectric layer 170 is higher than the polishing removal rate (or CMP removal rate) of the filling layer 168. Therefore, when the dielectric layer 170 is removed by a CMP process, the filling layer 168 is removed slightly by the same CMP process. The filling layer 168 is used as a CMP stop layer.

Figure 2G:
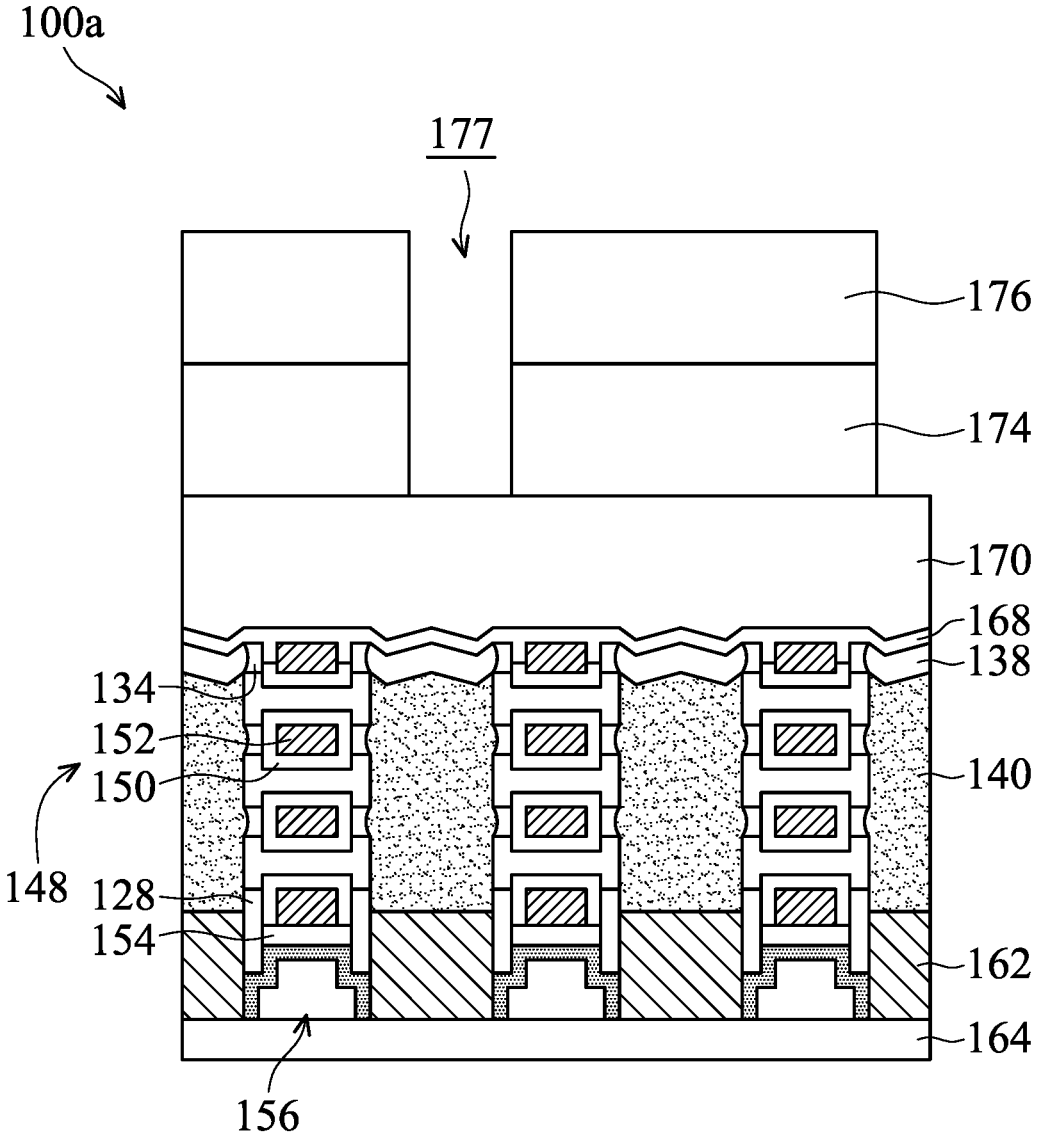

Afterwards, as shown in FIGS. 1V and 2G, a first mask layer 174 and a second mask layer 176 are formed over the dielectric layer 170 and they are patterned to form an opening 177, in accordance with some embodiments. The first mask layer 174 and the second mask layer 176 are used to pattern the underlying layers. The dielectric layer 170 is exposed by the opening 177.

Figure 2H:
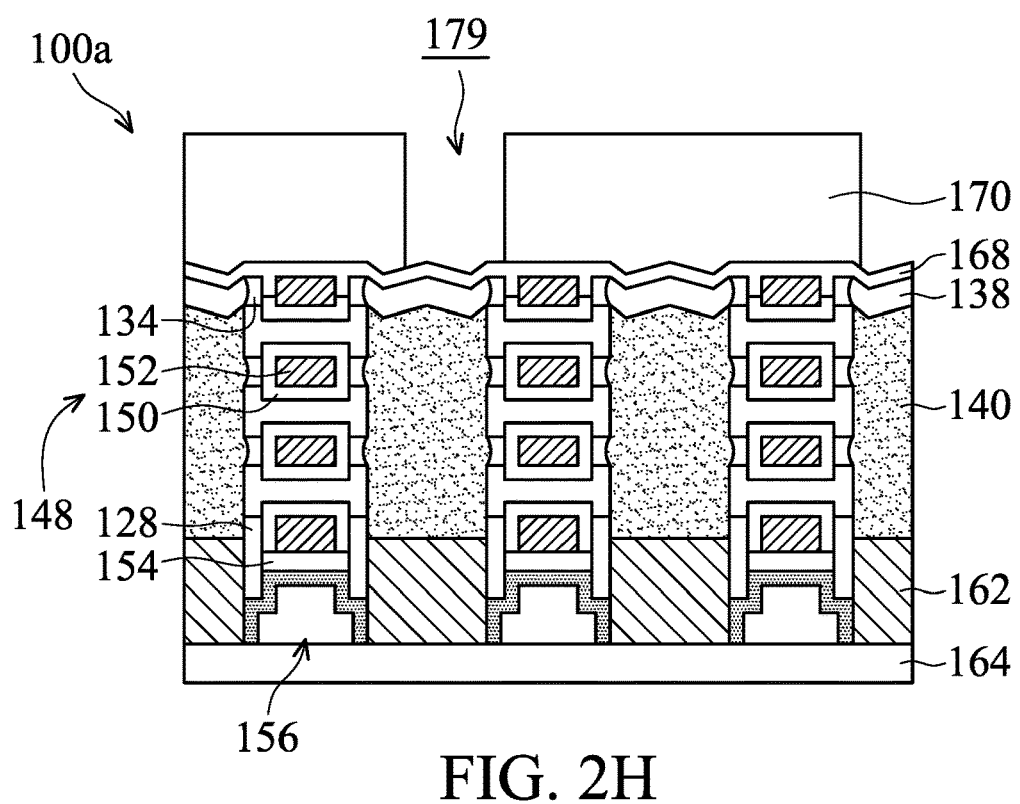

The first mask layer 174 and second mask layer 176 are made of different materials. In some embodiments, the first mask layer 174 and second mask layer 176 are independently made of SiO, SiOC, AlO, AlON, ZrO, HfO, TiO, ZrAlO, ZnO, SiOCN, SiOCN, SiCN or another applicable material. In some embodiments, the first mask layer 174 or the second mask layer 176 is a photoresist layer Next as shown in FIGS. 1W and 2H, the dielectric layer 170 is patterned to form a trench 179, in accordance with some embodiments. The filling layer 168 is exposed by the trench 179.

Figure 2I:
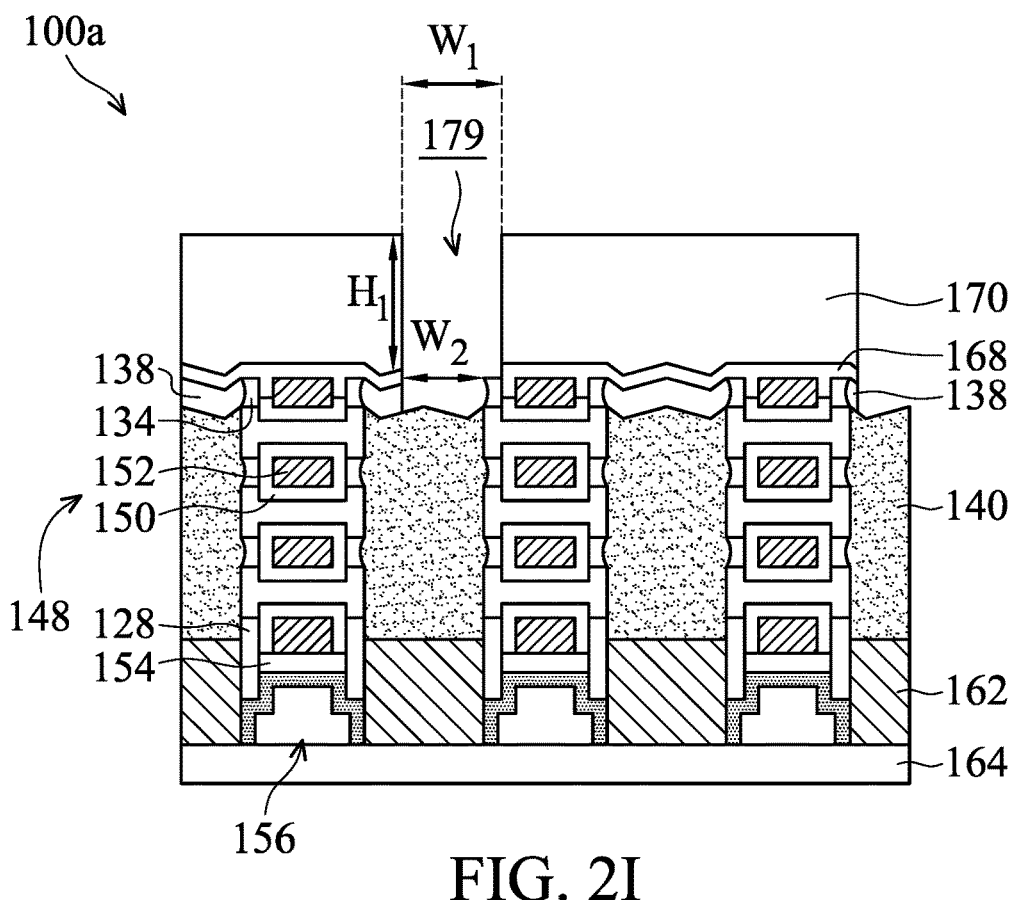

Afterwards, as shown in FIGS. 1X and 2I, the exposed filling layer 168 is removed, and then the exposed dielectric layer 138 is exposed, in accordance with some embodiments. As a result, the S/D structure 140 is exposed by the trench 179. The exposed filling layer 168 and the exposed dielectric layer 138 are removed by different etching processes.

The trench 179 has a top width $W_1$, a bottom width $W_2$, and a first height $H_1$. In some embodiments, the top width $W_1$ is in a range from about 15 nm to about 40 nm. In some embodiments, the bottom width $W_2$ is in a range from about 10 nm to about 35 nm. In some embodiments, the first height $H_1$ is in a range from about 15 nm to about 40 nm.

Figure 2J:
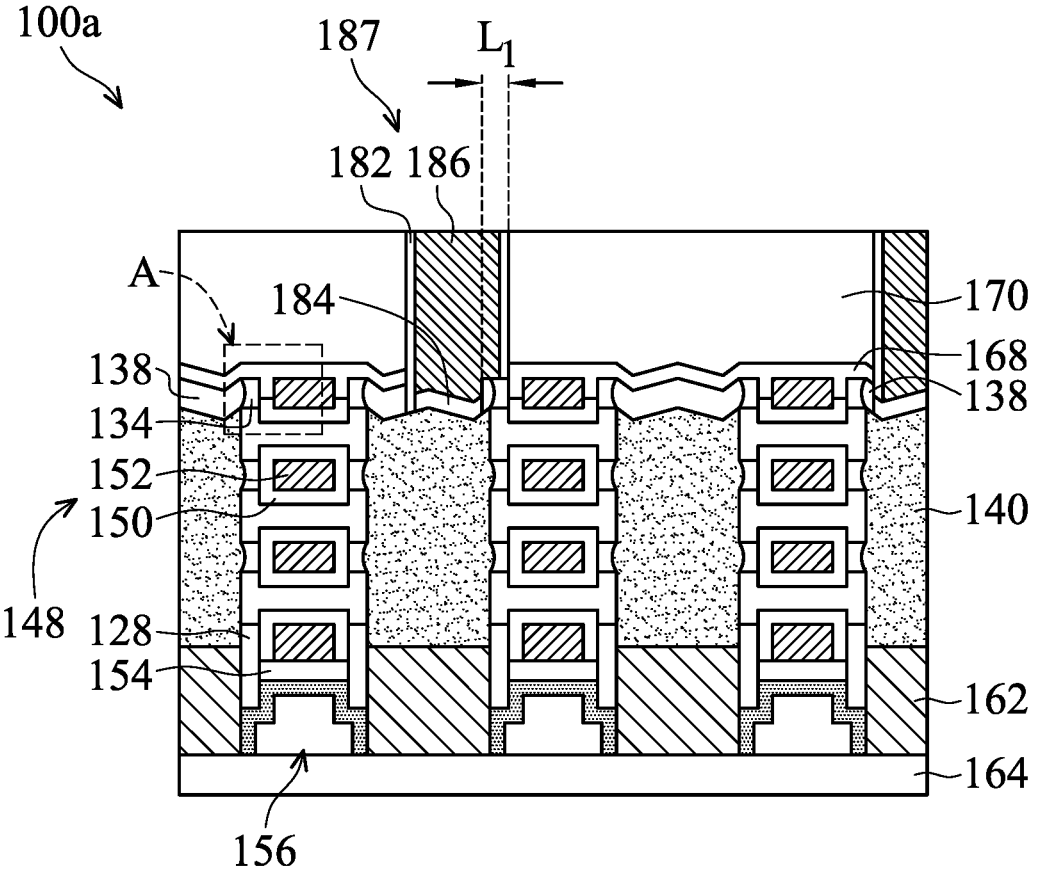

Next, as shown in FIGS. 1Y and 2J, a liner layer 182 is formed on a sidewall of the trench 179. More specifically, the liner layer 182 lining on the sidewall of the trench 179. The material of liner layer 182 is conformally formed in the trench 179 and the S/D structure 140. Next, a portion of the material of the liner layer 182 is removed by a dry etching process to form the liner layer 182 lining on the sidewall of the trench 179 and to expose the S/D structure 140. The liner layer 182 is configured to increase the isolation between the conductive layer 186 (formed later) and the gate structure 148. The liner layer 182 is in direct contact with the inner spacer 134, the filling layer 168 and the dielectric layer 170.

In some embodiments, the liner layer 182 is made of SiN, SiCN, SiOCN, SiOC, SiC or another applicable material. In some embodiments, the liner layer 182 is formed by a deposition process, such as chemical vapor deposition (CVD), physical vapor deposition, (PVD), atomic layer deposition (ALD), or another applicable processes. In some embodiments, the liner layer 182 has a thickness in a range from about 0.5 nm to about 3 nm.

Afterwards, a silicide layer 184 is formed on the exposed S/D structure 140. The silicide layer 184 is in direct contact with the S/D structure 140 and the liner layer 182. The top surface of the silicide layer 184 is lower than the top surface of the filling layer 168. The top surface of the silicide layer 184 is lower than the top surface of the gate electrode layer 152.

The silicide layer 184 may be formed by forming metal layers over the top surface of the S/D structures 140 and annealing the metal layers so the metal layers react with the S/D structures 140 to form the silicide layers. The unreacted metal layers may be removed after the silicide layers are formed. The silicide layers may be made of MoSi, RuSi, TiSi, NiSi, TiNiSi, CoSi, WSi, TaSi, PtSi, WSi, or the like. In some embodiments, the silicide layer 184 has a thickness in a range from about 1 nm to about 10 nm.

Next, a conductive layer 186 is formed in the trench 179, and then a polishing process (e.g. CMP) is performed until the dielectric layer 170 is exposed, in accordance with some embodiments. More specifically, the conductive material 186 is formed on the S/D structure 140.

A back-side S/D contact structure 187 is constructed by the conductive material 186 and the liner layer 182. Note that the front side source/drain (S/D) contact structure 162 and the back-side S/D contact structure 187 are respectively formed on opposite sides of the S/D structure 140. The back-side S/D contact structure 187 is electrically connected to the front side S/D contact structure 162 by the S/D structure 140. The dielectric layer 138 is between the S/D structure 140 and the filling layer 168. In addition, the dielectric layer 138 is in direct contact with the he S/D structure 140 and the filling layer 168. The back-side S/D contact structure 187 is in direct contact with the filling layer 168.

The conductive layer 186 may include ruthenium (Ru), cobalt (Co), copper (Cu), titanium (Ti), titanium nitride (TiN), tantalum (Ta), tantalum nitride (TaN), molybdenum (Mo), nickel (Ni), aluminum (Al) tungsten (W), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

In some embodiments, the conductive layer 186 is formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Liners and/or barrier layers (not shown) may be formed before the formation of the conductive materials of the back side S/D contact structure 187. The liners may be made of silicon nitride, although any other applicable dielectric may be used as an alternative. The barrier layer may be made of tantalum nitride, although other materials, such as tantalum, titanium, titanium nitride, or the like, may also be used.

It should be noted that if the gate dielectric layer 150 is not replaced by the filling layer 168, the isolation effect (or isolation capability) between the gate electrode layer 152 of the gate structure 148 and the back side S/D contact structure 187 depends on the inner spacer 134 and the gate dielectric layer 150. However, the isolation capability or ability of the gate dielectric layer 150 is not good enough when the distance between the gate electrode layer 152 of the gate structure 148 and the back side S/D contact structure 187 is gradually reduced. In order to improve the isolation capability or ability, a portion of the gate dielectric layer 150 is replaced with the filling layer 168 (having a dielectric constant (k) lower than that of the gate dielectric layer 150). Furthermore, the size of the back side S/D contact structure is also increased since the isolation capability is improved. The back side S/D contact structure may be formed directly over the nanostructures and close to the gate electrode layer 152. As a result, the reliability of the semiconductor structure 100a is improved since the isolation effect is improved.

Figure 3:
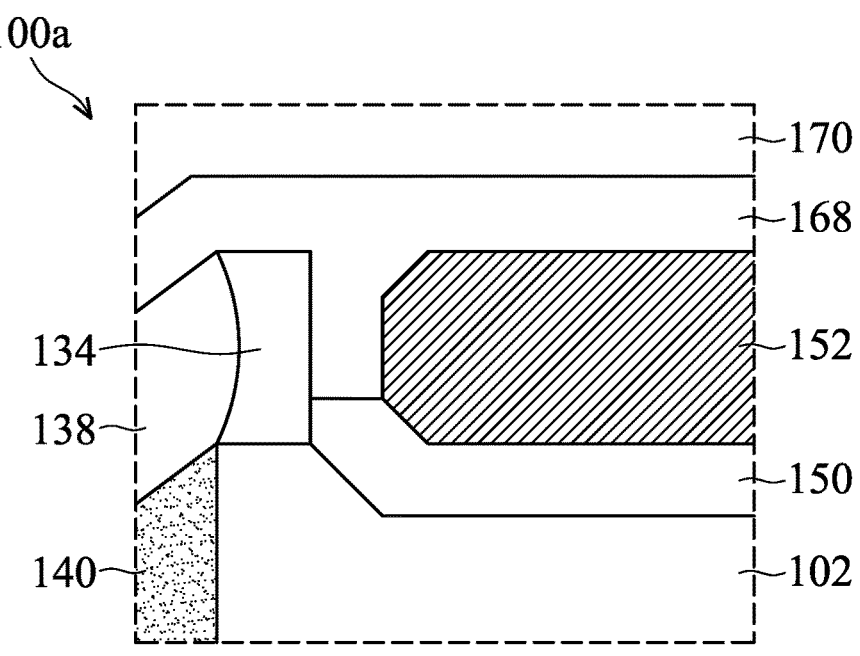
FIG. 3 shows an enlarged cross-sectional view of the semiconductor structure 100a of region A of FIG. 2J, in accordance with some embodiments.

FIG. 3 shows an enlarged cross-sectional view of the semiconductor structure 100a of region A of FIG. 2J, in accordance with some embodiments.

As shown in FIG. 3, the filling layer 168 is in direct contact with one of the gate dielectric layers 150. There is an interface between the filling layer 138 and the gate dielectric layer 150, and the interface is lower than the top surface of the gate electrode layer 152. In addition, the filling layer 168 is in direct contact with the dielectric layer 138.

A portion of the back side S/D contact structure 187 is landing on the top surface of the inner spacer layer 134. If no filling layer is between the gate electrode layer 152 and the back side S/D contact structure 187, the distance between the gate electrode layer 152 and the back side S/D contact structure 187 is limited. Since the filling layer 168 provide enough isolation capability, the portion of the back side S/D contact structure 187 is not only on the S/D structure 140, but also on the nanostructures 108'. The portion of the back side S/D contact structure 187 is directly on the nanostructures 108 and has a landing distance $L_1$ in a range from about 0.1 nm to about 5 nm. The gate electrode layer 152 is isolated from the back side S/D contact structure 187 by the filling layer 168.

The filling layer 138 has a better isolation ability or capability than the gate dielectric layer 150. The size of the back side S/D contact structure 187 is also increased since the isolation capability is improved. The back side S/D contact structure 187 may be close to the gate electrode layer 152 than the embodiment without forming the filling layer. As a result, the reliability of the semiconductor structure 100a is improved.

Figure 4:
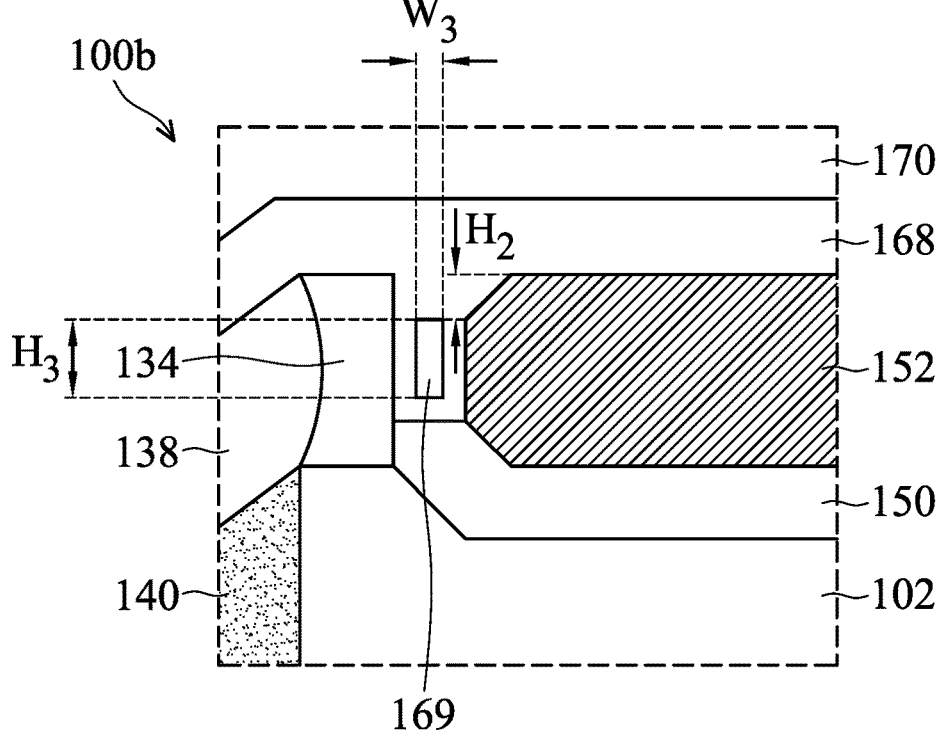
FIG. 4 shows a cross-sectional view of a semiconductor device structure, in accordance with some embodiments.

FIG. 4 shows a cross-sectional view of a semiconductor device structure 100b, in accordance with some embodiments. The semiconductor device structure 100b of FIG. 4 includes elements that are similar to, or the same as, elements of the semiconductor device structure 100a of FIG. 3, the difference between FIG. 4 and FIG. 3 is that there is an air gap 169 in the filling layer 168. More specifically, the air gap 169 is between the filling layer 168 and the gate dielectric layer. The air gap 169 is formed during the formation of the filling layer 168. The air gap 169 can improve the isolation ability between the gate electrode layer 152 of the gate structure 148 and the back side S/D contact structure 187.

As shown in FIG. 4, there is a second distance $H_2$ between the top surface of the air gap 169 and the top surface of the gate electrode layer 152. In some embodiments, the second height $H_2$ is in a range from about 0.1 nm to about 10 nm. The air gap 169 has a third width $W_3$ along a horizontal direction and a third height $H_3$ along a vertical direction. In some embodiments, the third width $W_3$ is in a range from about 0.5 nm to about 2 nm. In some embodiments, the third height $H_3$ is in a range from about 0.5 nm to about 6 nm.

Figure 5:
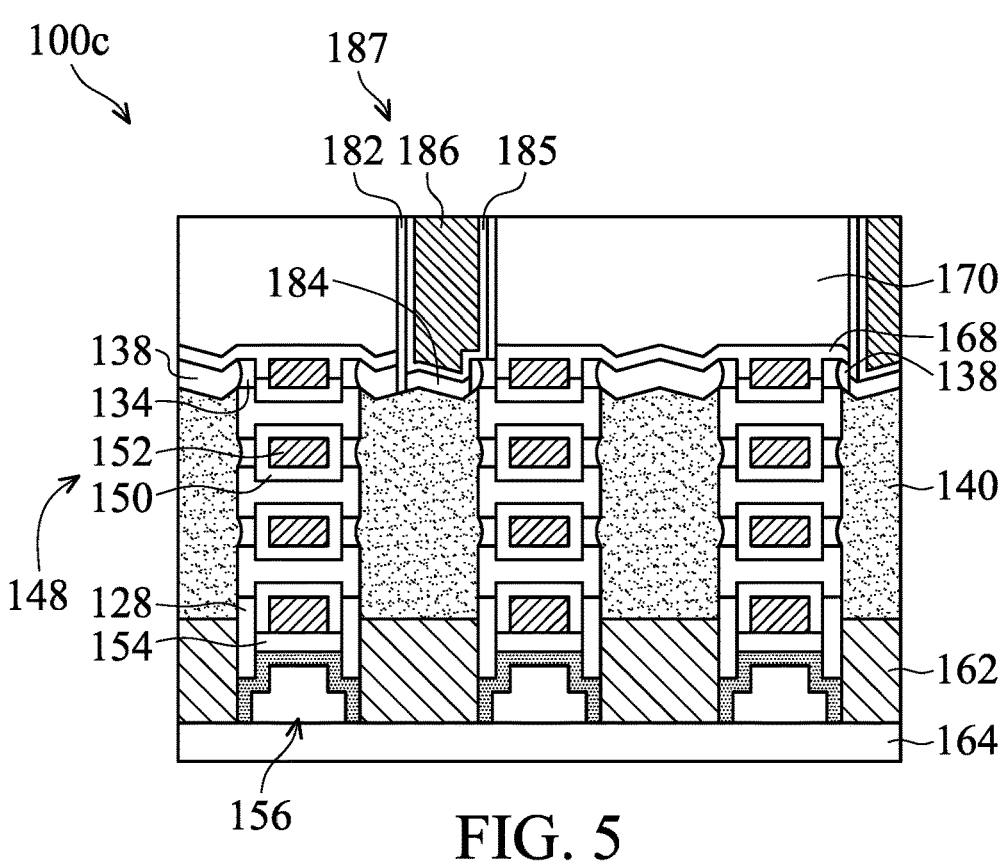
FIG. 5 shows a cross-sectional view of a semiconductor device structure, in accordance with some embodiments.

FIG. 5 shows a cross-sectional view of a semiconductor device structure 100c, in accordance with some embodiments. The semiconductor device structure 100b of FIG. 5 includes elements that are similar to, or the same as, elements of the semiconductor device structure 100a of FIG. 2J, the difference between FIG. 5 and FIG. 2J is that the back-side S/D contact structure 187 further includes a glue layer 185 between the liner layer 182 and the conductive layer 186. The glue layer 185 is configured to improve the adhesion between the liner layer 182 and the conductive layer 186.

In some embodiments, the glue layer 185 is made of TiN, TaN or applicable materials. In some embodiments, the glue layer 185 is formed by a deposition process, such as chemical vapor deposition (CVD), physical vapor deposition, (PVD), atomic layer deposition (ALD), or another applicable process. In some embodiments, the glue layer 185 has a thickness in a range from about 0.3 nm to about 3 nm.

Figure 6:
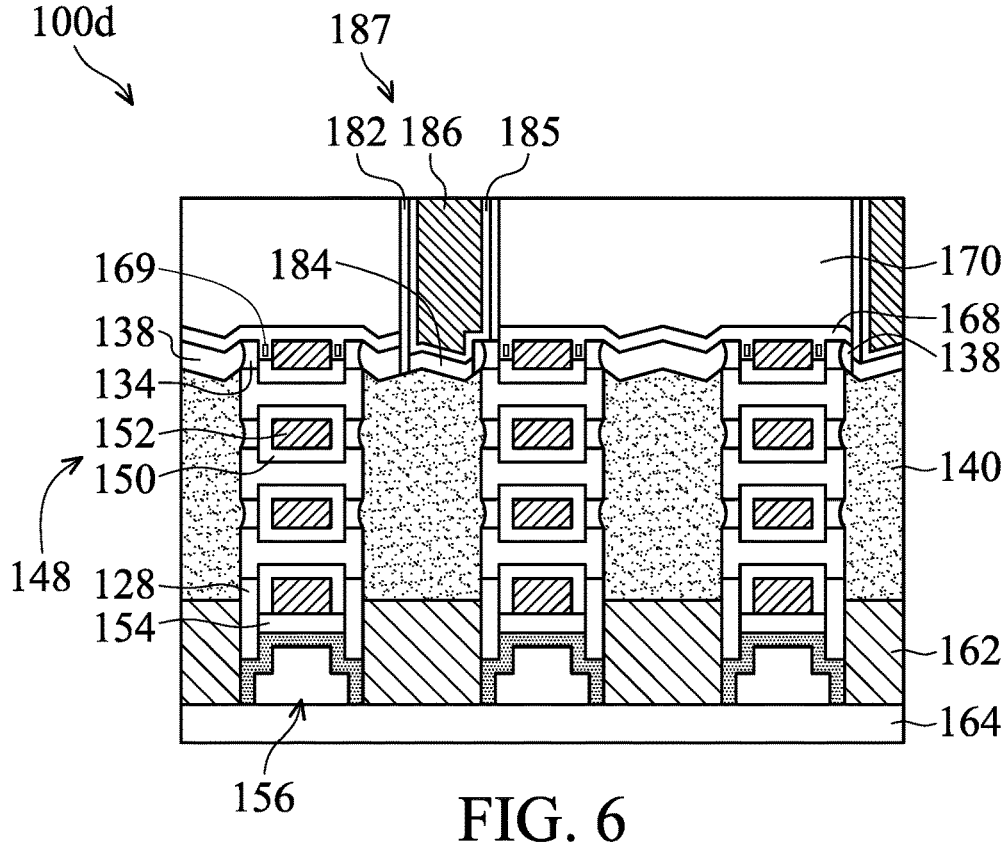
FIG. 6 shows a cross-sectional view of a semiconductor device structure, in accordance with some embodiments.

FIG. 6 shows a cross-sectional view of a semiconductor device structure 100d, in accordance with some embodiments. The semiconductor device structure 100b of FIG. 6 includes elements that are similar to, or the same as, elements of the semiconductor device structure 100c of FIG. 5, the difference between FIG. 6 and FIG. 5 is that the air gap 169 is in the filling layer 168. The air gap 169 is formed during the formation of the filling layer 168.

Figure 7:
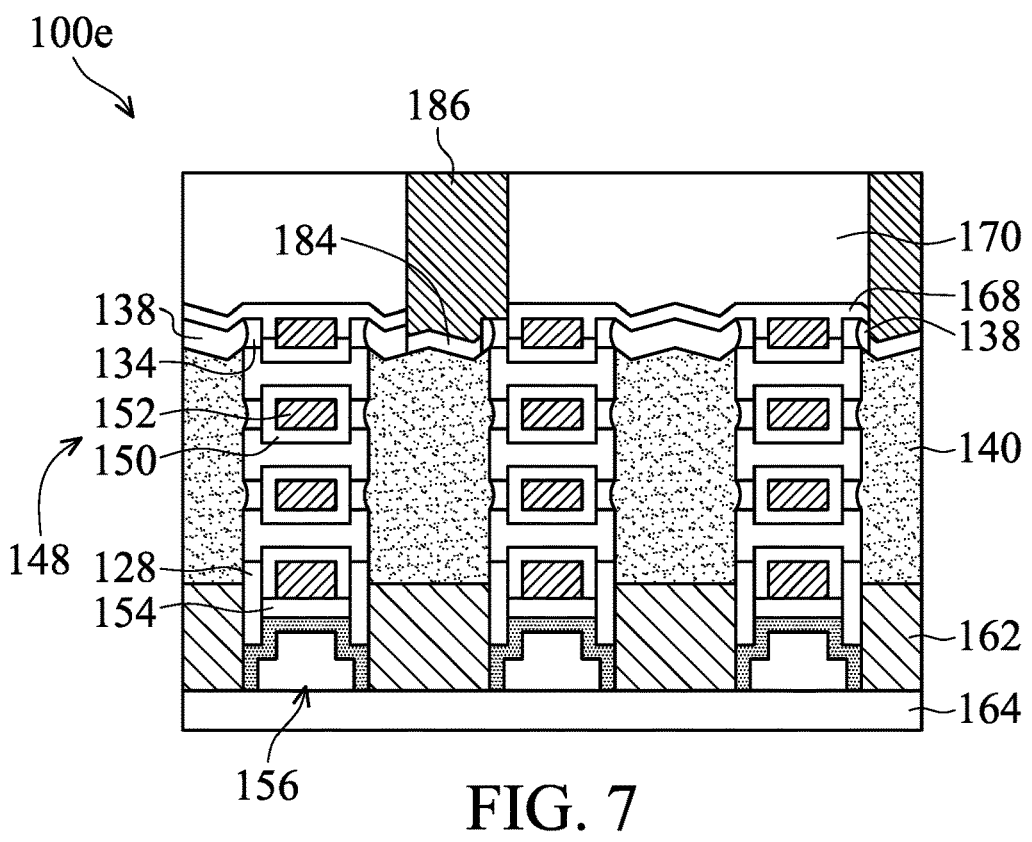
FIG. 7 shows a cross-sectional view of a semiconductor device structure, in accordance with some embodiments.

FIG. 7 shows a cross-sectional view of a semiconductor device structure 100e, in accordance with some embodiments. The semiconductor device structure 100e of FIG. 7 includes elements that are similar to, or the same as, elements of the semiconductor device structure 100a of FIG. 2J, the difference between FIG. 7 and FIG. 2J is that no liner layer is formed between the dielectric layer 170 and the conductive layer 186. The conductive layer 186 is in direct contact with the dielectric layer 170.

Figure 8:
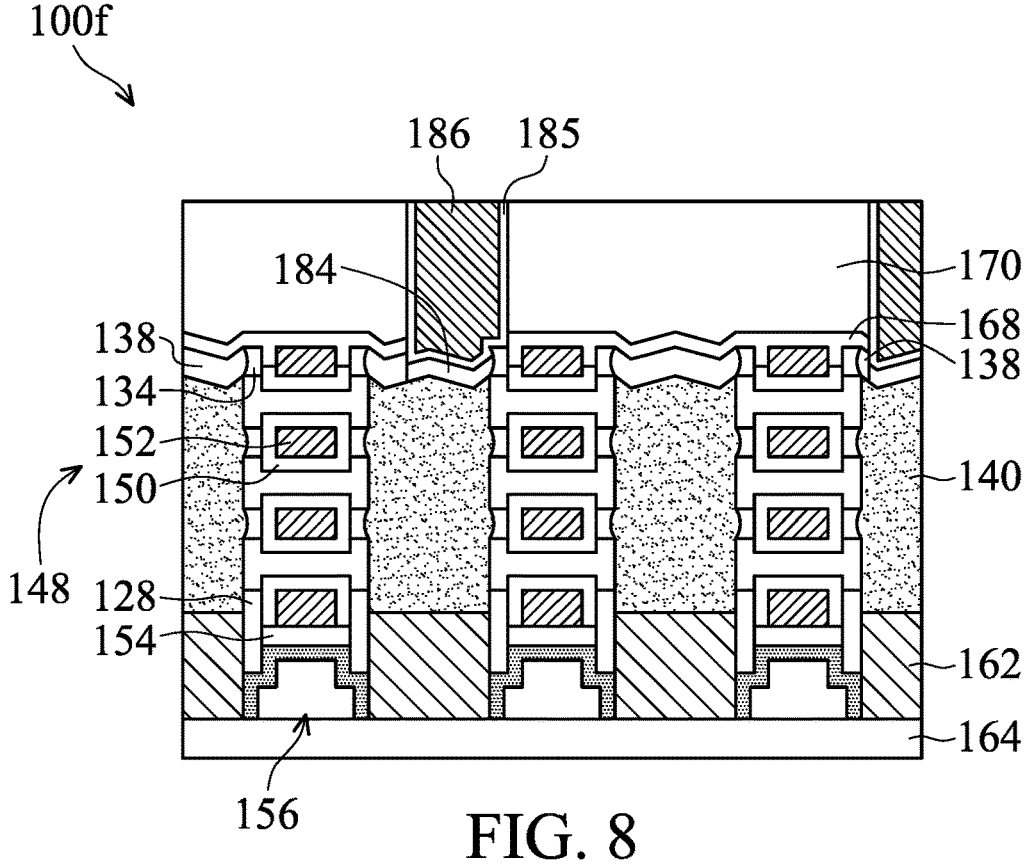
FIG. 8 shows a cross-sectional view of a semiconductor device structure, in accordance with some embodiments.

FIG. 8 shows a cross-sectional view of a semiconductor device structure 100f, in accordance with some embodiments. The semiconductor device structure 100f of FIG. 8 includes elements that are similar to, or the same as, elements of the semiconductor device structure 100c of FIG. 5, the difference between FIG. 8 and FIG. 5 is that no liner layer is formed between the glue layer 185 and the conductive layer 186. The glue layer 185 is in direct contact with the dielectric layer.

In addition, it should be noted that same elements in FIGS. 1A to 1Y may be designated by the same numerals and may include materials that are the same or similar and may be formed by processes that are the same or similar; therefore such redundant details are omitted in the interests of brevity. In addition, although FIGS. 1A to 1Y are described in relation to the method, it should be appreciated that the structures disclosed in FIGS. 1A to 1Y are not limited to the method but may stand alone as structures independent of the method. Similarly, the methods shown in FIGS. 1A to 1Y are not limited to the disclosed structures but may stand alone independent of the structures. Furthermore, the nanostructures described above may include nanowires, nanosheets, or other applicable nanostructures in accordance with some embodiments.

Also, while the disclosed methods are illustrated and described below as a series of acts or events, it should be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure may include nanostructures and a gate structure wrapping around the first and second nanostructures. An S/D structure is adjacent to the gate structure. A front side S/D contact structure and a back side S/D contact structure are on opposite sides of the S/D structure. The gate structure includes gate dielectric layers and gate electrode layers. A portion of the gate dielectric layer is replaced with the filling layer, and the filling layer is formed on the topmost gate electrode layer. The filling layer and the gate dielectric layer are made of different materials. The filling layer is between the gate electrode layer and the back side S/D contact structure to provide isolation capability. Therefore, the reliability and the performance of the semiconductor structure are improved.

In some embodiments, a semiconductor structure is provided. The semiconductor structure includes nanostructures over a substrate, and a gate structure surrounding the nanostructures, and the gate structure comprises gate dielectric layers and gate electrode layers. The semiconductor structure also includes a source/drain (S/D) structure adjacent to the gate structure, and a first S/D contact structure formed over the first side of the S/D structure. The semiconductor structure includes a filling layer formed on the topmost gate electrode layer and adjacent to the first S/D contact structure. The topmost surface of the gate dielectric layer is lower than the topmost surface of the gate electrode layer, and one of the gate dielectric layers is in direct contact with the filling layer.

In some embodiments, a semiconductor structure is provided. The semiconductor structure includes nanostructures over a substrate, and a gate structure surrounding the nanostructures. The gate structure includes gate dielectric layers and gate electrode layers. The semiconductor structure also includes a source/drain (S/D) structure adjacent to the gate structure, and an inner spacer layer between the gate structure and the S/D structure. The semiconductor structure further includes a filling layer over the gate structure, and the filling layer has a protrusion portion embedded in a space, the space is surrounded by the inner spacer, the gate dielectric layer and the gate electrode layer. The semiconductor structure also includes a first S/D contact structure formed over the filling layer.

In some embodiments, a method for forming a semiconductor structure is provided. The method includes forming a first fin structure protruding from the front side of a substrate, wherein the first fin structure comprises first semiconductor material layers and second semiconductor material layers alternately stacked. The method includes forming an isolation structure surrounding the first fin structure, and removing a portion of the first fin structure to form an S/D recess. The method also includes forming an S/D structure in the S/D recess, and removing the first semiconductor material layers to form gate trenches. The method includes forming a gate structure in the gate trenches, and the gate structure includes gate dielectric layers and gate electrode layers. The method includes removing a portion of the gate dielectric layer to form a recess, and forming a filling layer in the recess, and one of the gate dielectric layers is in direct contact with the filling layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
nanostructures over a substrate;
a gate structure surrounding the nanostructures, wherein the gate structure comprises gate dielectric layers and gate electrode layers;

a source/drain (S/D) structure adjacent to the gate structure;

a first S/D contact structure formed over a back side of the S/D structure;

a first layer formed on a topmost gate electrode layer and adjacent to the first S/D contact structure, wherein a topmost surface of the gate dielectric layer is lower than a topmost surface of the gate electrode layer filling; and a second S/D contact structure formed over a front side of the S/D structure, wherein the first S/D contact structure and the second S/D contact structure are on opposite sides of the S/D structure.

2. The semiconductor structure as claimed in claim 1, wherein the second S/D contact structure is electrically connected to the first S/D contact structure by the S/D structure.

3. The semiconductor structure as claimed in claim 1, further comprising:

an air gap formed in the first layer.

4. The semiconductor structure as claimed in claim 1, further comprising:

an inner spacer between the gate structure and the S/D structure, wherein the inner spacer is in direct contact with the first layer.

5. The semiconductor structure as claimed in claim 1, further comprising:

a silicide layer between the first S/D contact structure and the S/D structure, wherein a top surface of the silicide layer is lower than a top surface of the first layer.

6. The semiconductor structure as claimed in claim 1, further comprising:

a dielectric layer between the first layer and the S/D structure, wherein the dielectric layer is in direct contact with the first layer.

7. The semiconductor structure as claimed in claim 1, wherein the first S/D contact structure is in direct contact with the first layer.

8. The semiconductor structure as claimed in claim 1, wherein the first S/D contact structure comprises a first liner layer and a first conductive layer.

9. The semiconductor structure as claimed in claim 1, wherein an interface between the first layer and the gate dielectric layer is lower than the topmost surface of the gate electrode layer.

10. A semiconductor structure, comprising:

nanostructures over a substrate;

a gate structure surrounding the nanostructures, wherein the gate structure comprises gate dielectric layers and gate electrode layers;

a source/drain (S/D) structure adjacent to the gate structure;

an inner spacer layer between the gate structure and the S/D structure;

a first layer over the gate structure, wherein the first layer has a protrusion portion embedded in a space, the space is surrounded by the inner spacer layer, the gate dielectric layer and the gate electrode layer; and

a first S/D contact structure formed over the first layer, wherein the first layer is closer to a back side of the S/D structure than a front side of the S/D structure.

11. The semiconductor structure as claimed in claim 10, wherein the first layer and the gate dielectric layer are made of different materials.

12. The semiconductor structure as claimed in claim 10, wherein an interface between the first layer and the gate dielectric layer is lower than a topmost surface of the gate electrode layer.

13. The semiconductor structure as claimed in claim 10, further comprising:

a second S/D contact structure formed over a second side of the S/D structure, wherein the second S/D contact structure is electrically connected to the first S/D contact structure by the S/D structure.

14. The semiconductor structure as claimed in claim 10, further comprising:

an air gap between the first layer and one of the gate dielectric layers.

15. The semiconductor structure as claimed in claim 10, further comprising:

a dielectric layer between the first layer and the S/D structure, wherein the dielectric layer is in direct contact with the first layer.

16. The semiconductor structure as claimed in claim 10, wherein the gate electrode layer is isolated from the first S/D contact structure by the first layer.

17. A semiconductor structure, comprising:

nanostructures over a substrate;

a gate structure surrounding the nanostructures, wherein the gate structure comprises gate dielectric layers and gate electrode layers;

a source/drain (S/D) structure adjacent to the gate structure;

an inner spacer layer between the gate structure and the S/D structure;

a first layer over the gate structure, wherein the first layer has a vertical portion and horizontal portion, and the vertical portion is between the inner spacer layer and the gate electrode layer; and a first S/D contact structure formed over the S/D structure, wherein the first layer is between the gate structure and the first S/D contact structure, and the horizontal portion of the first layer is closer to the first S/D contact structure than the vertical portion of layer.

18. The semiconductor structure as claimed in claim 17, further comprising:

a dielectric layer between the first layer and the S/D structure.

19. The semiconductor structure as claimed in claim 17, wherein a bottommost surface of the first layer is lower than a topmost surface of the inner spacer layer.

20. The semiconductor structure as claimed in claim 17, wherein the first layer covers a topmost surface of the inner spacer layer.

* * * * *